(12) United States Patent
Li et al.

(10) Patent No.: US 12,349,392 B2
(45) Date of Patent: Jul. 1, 2025

(54) SEMICONDUCTOR DEVICE AND MANUFACTURING METHOD THEREOF

(71) Applicant: TAIWAN SEMICONDUCTOR MANUFACTURING COMPANY, LTD., Hsinchu (TW)

(72) Inventors: Kun-Mu Li, Zhudong Township (TW); Liang-Yi Chen, Taipei (TW); Wen-Chu Hsiao, Tainan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 533 days.

(21) Appl. No.: 17/723,033

(22) Filed: Apr. 18, 2022

(65) Prior Publication Data

US 2022/0238709 A1 Jul. 28, 2022

Related U.S. Application Data

(60) Continuation of application No. 16/417,051, filed on May 20, 2019, now Pat. No. 11,309,418, which is a
(Continued)

(51) Int. Cl.
*H10D 30/62* (2025.01)
*H01L 21/768* (2006.01)
(Continued)

(52) U.S. Cl.
CPC ......... *H10D 30/62* (2025.01); *H10D 30/0212* (2025.01); *H10D 30/024* (2025.01);
(Continued)

(58) Field of Classification Search
CPC . H01L 29/785; H01L 29/0847; H01L 29/665; H01L 29/6656; H01L 29/66795; H01L 29/165
See application file for complete search history.

(56) References Cited

U.S. PATENT DOCUMENTS 8,362,575 B2 1/2013 Kwok et al.
8,878,300 B1 11/2014 Liu et al.
(Continued)

FOREIGN PATENT DOCUMENTS

KR 10-2016-0119889 A 10/2016
KR 10-2016-0125208 A 10/2016
(Continued)

OTHER PUBLICATIONS

Office Action issued in corresponding Korean Patent Application No. 10-2017-0167659 dated Mar. 1, 2019.
(Continued)

*Primary Examiner* — Mark W Tornow
(74) *Attorney, Agent, or Firm* — STUDEBAKER BRACKETT PLLC

(57) ABSTRACT

A semiconductor device includes a gate structure formed over a channel region of the semiconductor device, a source/drain region adjacent the channel region, and an electrically conductive contact layer over the source/drain region. The source/drain region includes a first epitaxial layer having a first material composition and a second epitaxial layer formed over the first epitaxial layer. The second epitaxial layer has a second material composition different from the first composition. The electrically conductive contact layer is in contact with the first and second epitaxial layers. A bottom of the electrically conductive contact layer is located below an uppermost portion of the first epitaxial layer.

20 Claims, 11 Drawing Sheets

Related U.S. Application Data division of application No. 15/725,091, filed on Oct. 4, 2017, now Pat. No. 10,297,690.

(60) Provisional application No. 62/441,028, filed on Dec. 30, 2016.

(51) Int. Cl.
| | |
|---|---|
| *H10D 30/01* | (2025.01) |
| *H10D 30/69* | (2025.01) |
| *H10D 62/10* | (2025.01) |
| *H10D 62/13* | (2025.01) |
| *H10D 62/822* | (2025.01) |
| *H10D 62/832* | (2025.01) |
| *H10D 64/01* | (2025.01) |
| *H10D 84/01* | (2025.01) |
| *H10D 84/03* | (2025.01) |

(52) U.S. Cl.
CPC ....... *H10D 30/6219* (2025.01); *H10D 62/151* (2025.01); *H10D 64/021* (2025.01); *H10D 84/0158* (2025.01); *H10D 84/0193* (2025.01); *H10D 84/038* (2025.01); *H01L 21/76805* (2013.01); *H01L 21/76829* (2013.01); *H01L 21/76897* (2013.01); *H10D 30/797* (2025.01); *H10D 62/115* (2025.01); *H10D 62/116* (2025.01); *H10D 62/121* (2025.01); *H10D 62/822* (2025.01); *H10D 62/832* (2025.01)

(56) References Cited

U.S. PATENT DOCUMENTS

| | | | |
|---|---|---|---|
| 9,680,020 | B2 | 6/2017 | Basker et al. |
| 11,309,418 | B2* | 4/2022 | Li .................. H01L 29/0847 |
| 2011/0073952 | A1 | 3/2011 | Kwok et al. |
| 2016/0027918 | A1 | 1/2016 | Kim et al. |
| 2016/0064483 | A1 | 3/2016 | Kelly et al. |
| 2016/0293717 | A1 | 10/2016 | Kim et al. |
| 2016/0315081 | A1* | 10/2016 | Park .................. H01L 29/41791 |
| 2017/0148797 | A1* | 5/2017 | Kim .................. H01L 29/456 |

FOREIGN PATENT DOCUMENTS

| | | |
|---|---|---|
| TW | 201607030 A | 2/2016 |
| TW | 201628079 A | 8/2016 |
| TW | 201640586 A | 11/2016 |

OTHER PUBLICATIONS

Notice of Allowance issued in related U.S. Appl. No. 15/725,091 dated Mar. 18, 2019.
Non-Final Office Action issued in related U.S. Appl. No. 16/417,051 dated Mar. 13, 2020.
Final Office Action issued in related U.S. Appl. No. 16/417,051 dated Aug. 28, 2020.
Non-Final Office Action issued in related U.S. Appl. No. 16/417,051 dated Mar. 10, 2021.
Final Office Action issued in related U.S. Appl. No. 16/417,051 dated Jul. 19, 2021.
Notice of Allowance issued in related U.S. Appl. No. 16/417,051 dated Dec. 15, 2021.

* cited by examiner

SEMICONDUCTOR DEVICE AND MANUFACTURING METHOD THEREOF

CROSS-REFERENCE TO RELATED APPLICATIONS

This application is a continuation application of U.S. patent application Ser. No. 16/417,051 filed on May 20, 2019, now U.S. Pat. No. 11,309,418, which is a divisional application of U.S. patent application Ser. No. 15/725,091 filed on Oct. 4, 2017, now U.S. Pat. No. 10,297,690, which claims priority to U.S. Provisional Patent Application 62/441,028 filed Dec. 30, 2016, the entire disclosure of each of which is incorporated herein by reference.

TECHNICAL FIELD

The disclosure relates to a semiconductor integrated circuit, and more particularly to a semiconductor device having an epitaxial source/drain (S/D) structure with voids and its manufacturing process.

BACKGROUND

As the semiconductor industry has progressed into nanometer technology process nodes in pursuit of higher device density, higher performance, and lower costs, challenges from both fabrication and design issues have resulted in the development of three-dimensional designs, such as a multi-gate field effect transistor (FET) including a FinFET (FinFET). In a FinFET, a gate electrode is adjacent to three side surfaces of a channel region with a gate dielectric layer interposed therebetween. As the size of the FinFET shrinks, the electrode contact area on the S/D shrinks, thereby increasing the contact resistance. As transistor dimensions are continually scaled down, further improvements of the FinFET are required.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 5A is a perspective view, FIG. 5B is a cross sectional view along line a-a of FIG. 5A and FIG. 5C is a cross sectional view along line b-b of FIG. 5A.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanied drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in/between the described operations, and the order of operations may be changed.

FIGS. 1-14 show views of various stages for manufacturing a semiconductor FinFET device according to embodiments of the present disclosure. It is understood that additional operations can be provided before, during, and after processes shown by FIGS. 1-14, and some of the operations described below can be replaced or eliminated, for additional embodiments of the method. The order of the operations/processes may be interchangeable.

Figure 1:
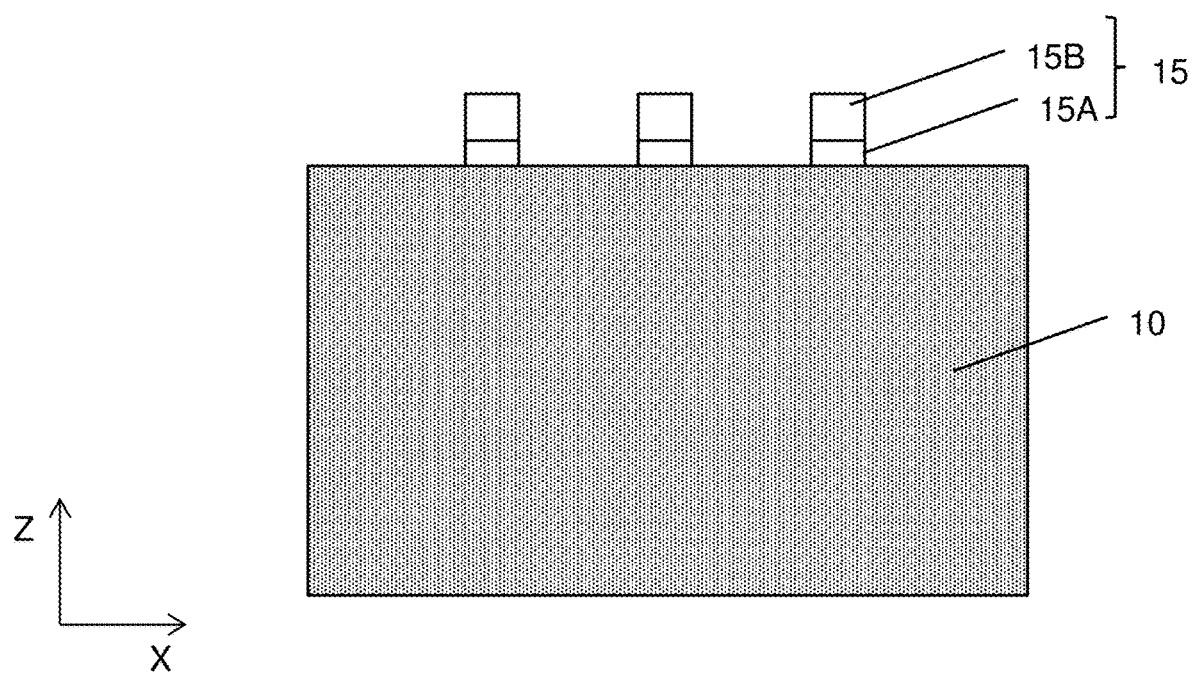
FIG. 1 shows one of various stages for manufacturing a semiconductor FinFET device according to embodiments of the present disclosure.
Figure 2:
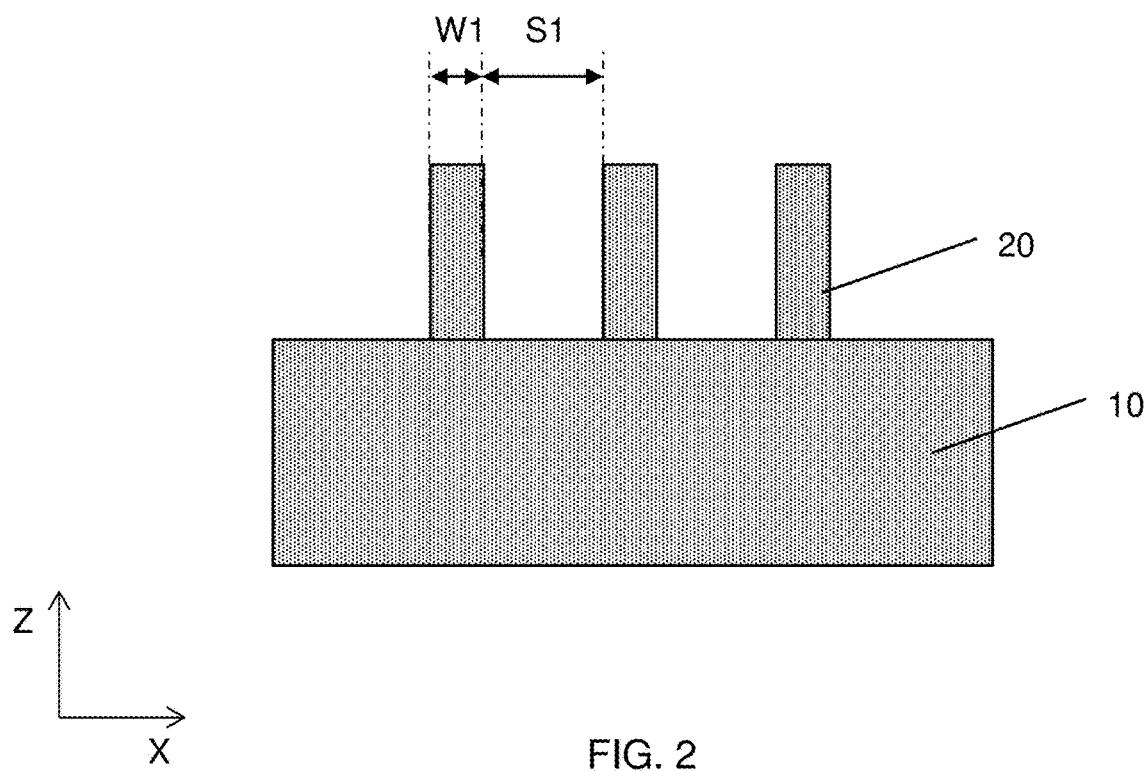
FIG. 2 shows one of various stages for manufacturing a semiconductor FinFET device according to embodiments of the present disclosure.
Figure 3:
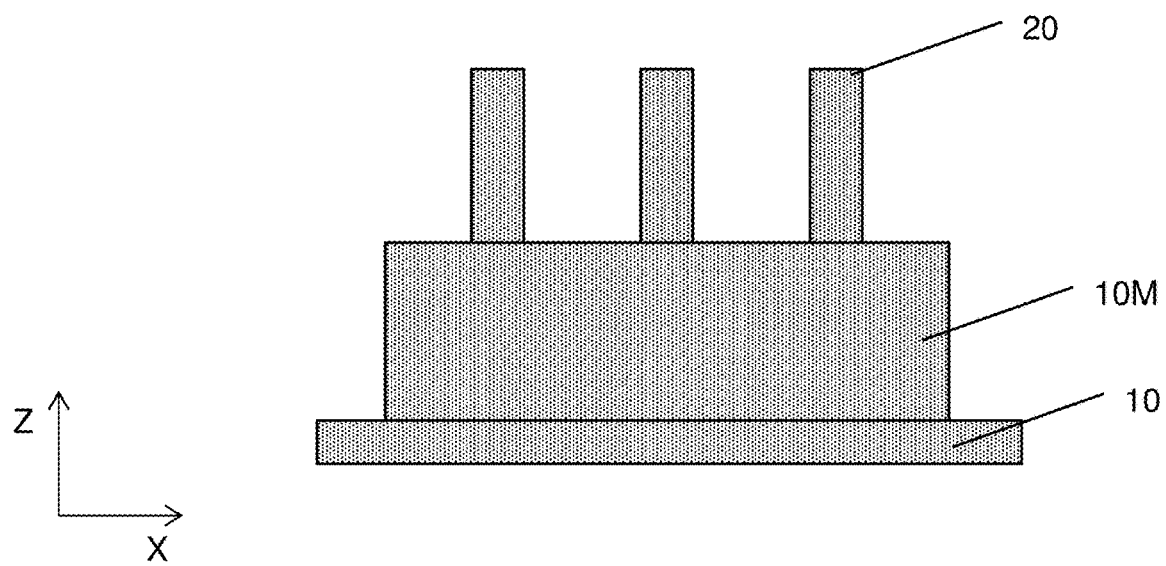
FIG. 3 shows one of various stages for manufacturing a semiconductor FinFET device according to embodiments of the present disclosure.

In FIGS. 1-3, one or more fin structures are formed. A mask layer 15 is formed over a substrate 10. The mask layer 15 is formed by, for example, a thermal oxidation process and/or a chemical vapor deposition (CVD) process. The substrate 10 is, for example, a p-type silicon or germanium substrate with an impurity concentration in a range from about $1\times10^{15}$ atoms/cm$^3$ to about $1\times10^{16}$ atoms/cm$^3$. In other embodiments, the substrate is an n-type silicon or germanium substrate with an impurity concentration in a range from about $1\times10^{15}$ atoms/cm$^3$ to about $1\times10^{16}$ atoms/cm$^3$.

Alternatively, the substrate 10 may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate 10 is a silicon layer of an SOI (silicon-on insulator) substrate. Amorphous substrates, such as amorphous Si or amorphous SiC, or insulating material, such as silicon oxide may also be used as the substrate 10. The substrate 10 may include various regions that have been suitably doped with impurities (e.g., p-type or n-type conductivity).

The mask layer 15 includes, for example, a pad oxide (e.g., silicon oxide) layer 15A and a silicon nitride mask layer 15B in some embodiments.

The pad oxide layer 15A may be formed by using thermal oxidation or a CVD process. The silicon nitride mask layer 15B may be formed by a physical vapor deposition (PVD), such as a sputtering method, a CVD, plasma-enhanced chemical vapor deposition (PECVD), an atmospheric pressure chemical vapor deposition (APCVD), a low-pressure CVD (LPCVD), a high density plasma CVD (HDPCVD), an atomic layer deposition (ALD), and/or other processes.

The thickness of the pad oxide layer 15A is in a range from about 2 nm to about 15 nm and the thickness of the silicon nitride mask layer 15B is in a range from about 2 nm to about 50 nm in some embodiments. A mask pattern is further formed over the mask layer. The mask pattern is, for example, a resist pattern formed by lithography operations.

By using the mask pattern as an etching mask, a hard mask pattern 15 of the pad oxide layer and the silicon nitride mask layer is formed, as shown in FIG. 1.

Then, as shown in FIG. 2, by using the hard mask pattern 15 as an etching mask, the substrate 10 is patterned into fin structures 20 by trench etching using a dry etching method and/or a wet etching method.

In other embodiments, The fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fin structures.

In FIG. 2, three fin structures 20 are disposed over the substrate 10. However, the number of the fin structures is not limited to three. The numbers may be as small as one or more than three. In addition, one or more dummy fin structures may be disposed adjacent both sides of the fin structure 20 to improve pattern fidelity in patterning processes.

The fin structure 20 may be made of the same material as the substrate 10 and may continuously extend from the substrate 10. In this embodiment, the fin structure is made of Si. The silicon layer of the fin structure 20 may be intrinsic, or appropriately doped with an n-type impurity or a p-type impurity.

The width W1 of the fin structure 20 is in a range from about 5 nm to about 40 nm in some embodiments, and is in a range from about 7 nm to about 12 nm in other embodiments. The space S1 between two fin structures is in a range from about 10 nm to about 50 nm in some embodiments. The height (along the Z direction) of the fin structure 20 is in a range from about 100 nm to about 300 nm in some embodiments, and is in a range from about 50 nm to 100 nm in other embodiments.

The lower part of the fin structure 20 under the gate structure 40 (see, FIG. 5A) may be referred to as a well region, and the upper part of the fin structure 20 may be referred to as a channel region. Under the gate structure 40, the well region is embedded in the isolation insulating layer 30 (see, FIG. 5A), and the channel region protrudes from the isolation insulating layer 30. A lower part of the channel region may also be embedded in the isolation insulating layer 30 to a depth of about 1 nm to about 5 nm.

The height of the well region is in a range from about 60 nm to 100 nm in some embodiments, and the height of the channel region is in a range from about 40 nm to 60 nm, and is in a range from about 38 nm to about 55 nm in other embodiments.

After the fin structures 20 are formed, the substrate 10 is further etched to form a mesa shape 10M in some embodiments, as shown in FIG. 3. In other embodiments, the mesa shape 10M is first formed, and then the fin structures 20 are formed. In certain embodiments, the mesa shape is not formed and the fin structures 20 directly protrude from the substrate 10.

After the fin structures 20 and the mesa shape 10M are formed, the isolation insulating layer 30 is formed in spaces between the fin structures and/or a space between one fin structure and another element formed over the substrate 10. The isolation insulating layer 30 may also be called a "shallow-trench-isolation (STI)" layer. The insulating material for the isolation insulating layer 30 may include one or more layers of silicon oxide, silicon nitride, silicon oxynitride (SiON), SiOCN, fluorine-doped silicate glass (FSG), or a low-k dielectric material. The isolation insulating layer is formed by LPCVD (low pressure chemical vapor deposition), plasma-CVD or flowable CVD. In the flowable CVD, flowable dielectric materials instead of silicon oxide may be deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove undesired element(s) to form silicon oxide. When the undesired element(s) is removed, the flowable film densifies and shrinks. In some embodiments, multiple anneal processes are conducted. The flowable film is cured and annealed more than once. The flowable film may be doped with boron and/or phosphorous.

Figure 4:
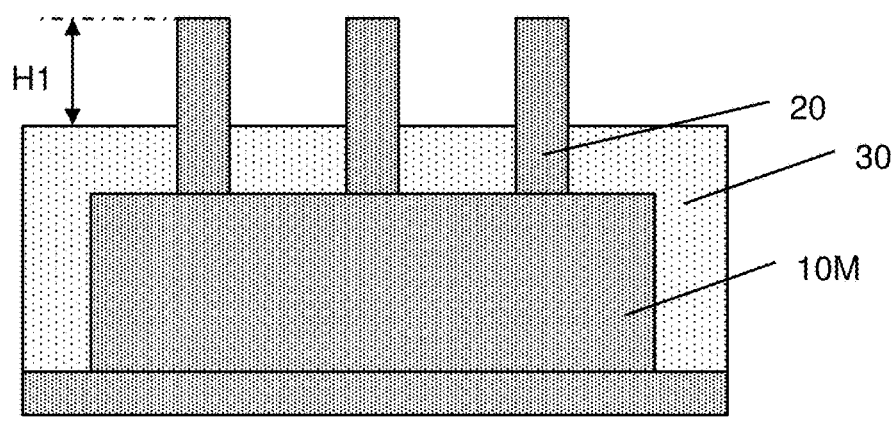
FIG. 4 shows one of various stages for manufacturing a semiconductor FinFET device according to embodiments of the present disclosure.

The insulating layer 30 is first formed in a thick layer so that the fin structures are embedded in the thick layer, and the thick layer is recessed so as to expose the upper portions of the fin structures 20 in some embodiments, as shown in FIG. 4. The height H1 of the fin structures from the upper surface of the isolation insulating layer 30 is in a range from about 20 nm to about 100 nm in some embodiments, and is in a range from about 30 nm to about 50 nm in other embodiments. After or before recessing the isolation insulating layer 30, a thermal process, for example, an anneal process, may be performed to improve the quality of the isolation insulating layer 30. In certain embodiments, the thermal process is performed by using rapid thermal annealing (RTA) at a temperature in a range from about 900° C. to about 1050° C. for about 1.5 seconds to about 10 seconds in an inert gas ambient, such as an $N_2$, Ar or He ambient.

Figure 5A:
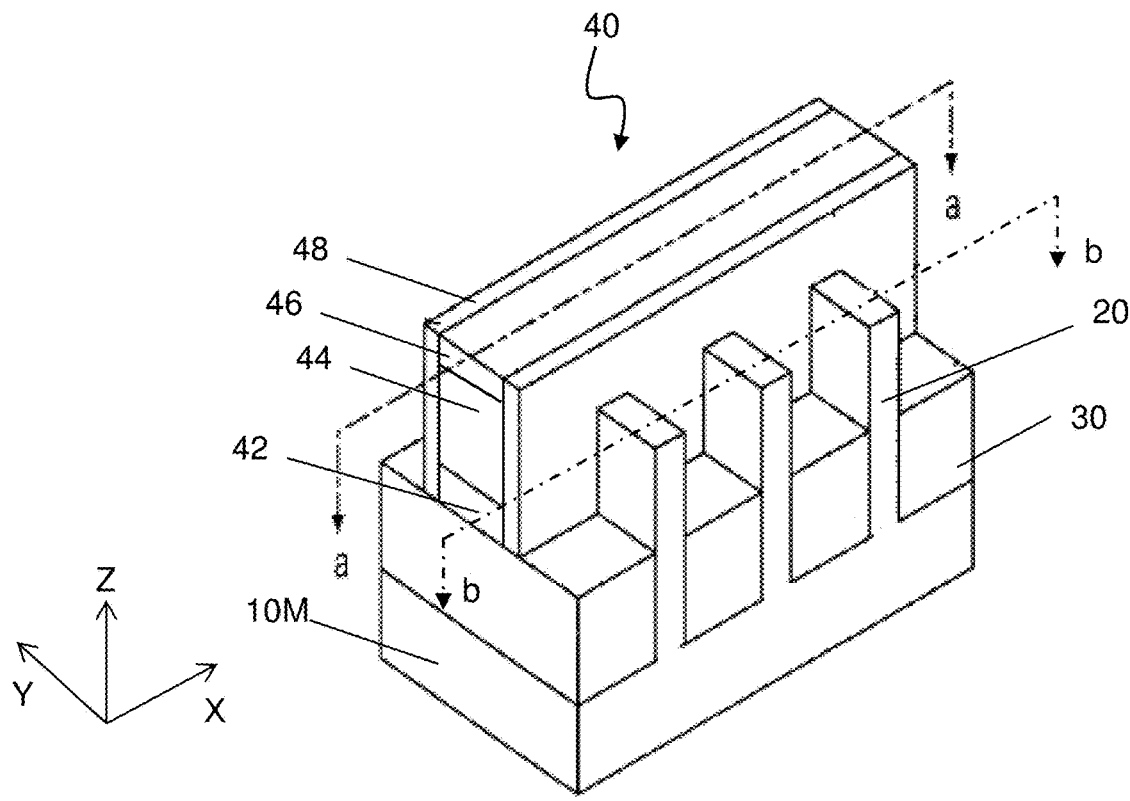
FIGS. 5A-5C show one of various stages for manufacturing a semiconductor FinFET device according to embodiments of the present disclosure.
Figure 5B:
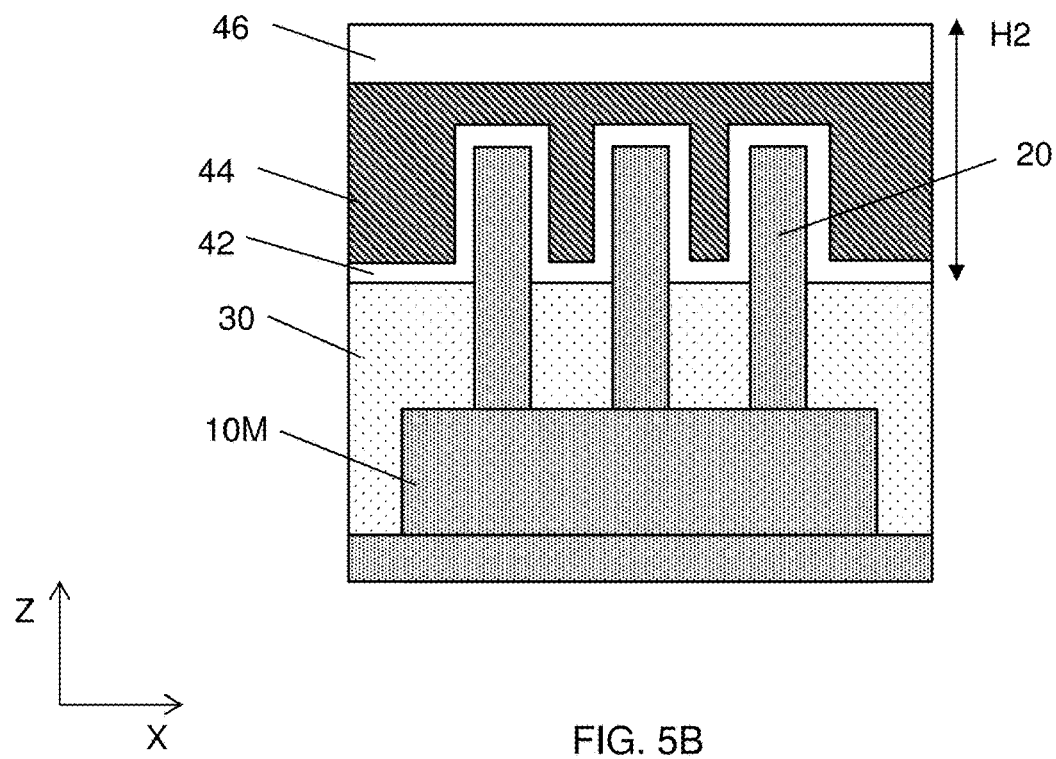
Figure 5C:
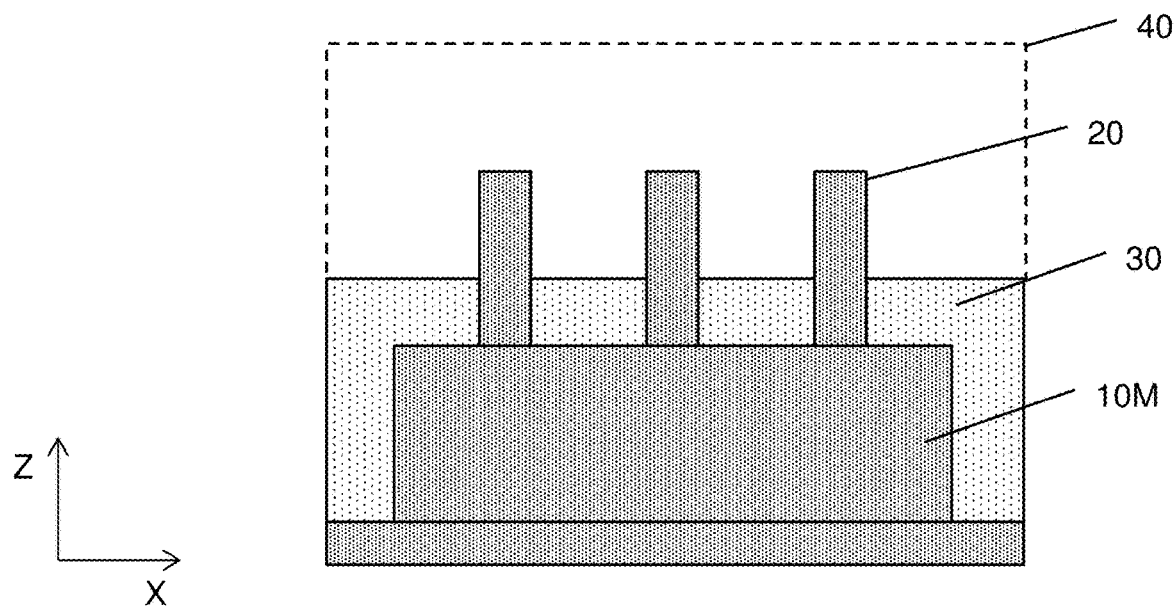

After the insulating layer 30 is formed, a gate structure 40 is formed over the fin structures 20, as shown in FIGS. 5A-5C. FIG. 5A is an exemplary perspective view, FIG. 5B is an exemplary cross sectional view along line a-a of FIG. 5A and FIG. 5C is an exemplary cross sectional view along line b-b of FIG. 5A. FIGS. 6-14 are also exemplary cross sectional views along line b-b of FIG. 5A.

As shown in FIG. 5A, the gate structure 40 extends in the X direction, while the fin structures 20 extend in the Y direction.

To fabricate the gate structure 40, a dielectric layer and a poly silicon layer are formed over the isolation insulating layer 30 and the exposed fin structures 20, and then patterning operations are performed so as to obtain gate structures including a gate pattern 44 made of poly silicon and a dielectric layer 42. In some embodiments, the polysilicon layer is patterned by using a hard mask and the hard mask remains on the gate pattern 44 as a cap insulating layer 46. The hard mask (cap insulating layer 46) includes one or more layers of insulating material. The cap insulating layer 46 includes a silicon nitride layer formed over a silicon oxide layer in some embodiments. In other embodiments, the cap insulating layer 46 includes a silicon oxide layer formed over a silicon nitride layer. The insulating material for the cap insulating layer 46 may be formed by CVD, PVD, ALD, e-beam evaporation, or other suitable process. In some embodiments, the dielectric layer 42 may include one or more layers of silicon oxide, silicon nitride, silicon oxy-nitride, or high-k dielectrics. In some embodiments, a thickness of the dielectric layer 42 is in a range from about 2 nm to about 20 nm, and in a range from about 2 nm to about 10 nm in other embodiments. The height H2 of the gate structure is in a range from about 50 nm to about 400 nm in some embodiments, and is in a range from about 100 nm to 200 nm in other embodiments.

In some embodiments, a gate replacement technology is employed. In such a case, the gate pattern 44 and the dielectric layer 42 are a dummy gate electrode and a dummy gate dielectric layer, respectively, which are subsequently removed. If a gate-first technology is employed, the gate pattern 44 and the dielectric layer 42 are used as a gate electrode and a gate dielectric layer.

Further, gate sidewall spacers 48 are formed on both sidewalls of the gate pattern 44. The sidewall spacers 48 include one or more layers of insulating material, such as $SiO_2$, SiN, SiON, SiOCN or SiCN, which are formed by CVD, PVD, ALD, e-beam evaporation, or other suitable process. A low-k dielectric material may be used as the sidewall spacers. The sidewall spacers 48 are formed by forming a blanket layer of insulating material and performing anisotropic etching. In one embodiment, the sidewall spacer layers are made of silicon nitride based material, such as SiN, SiON, SiOCN or SiCN.

Figure 6:
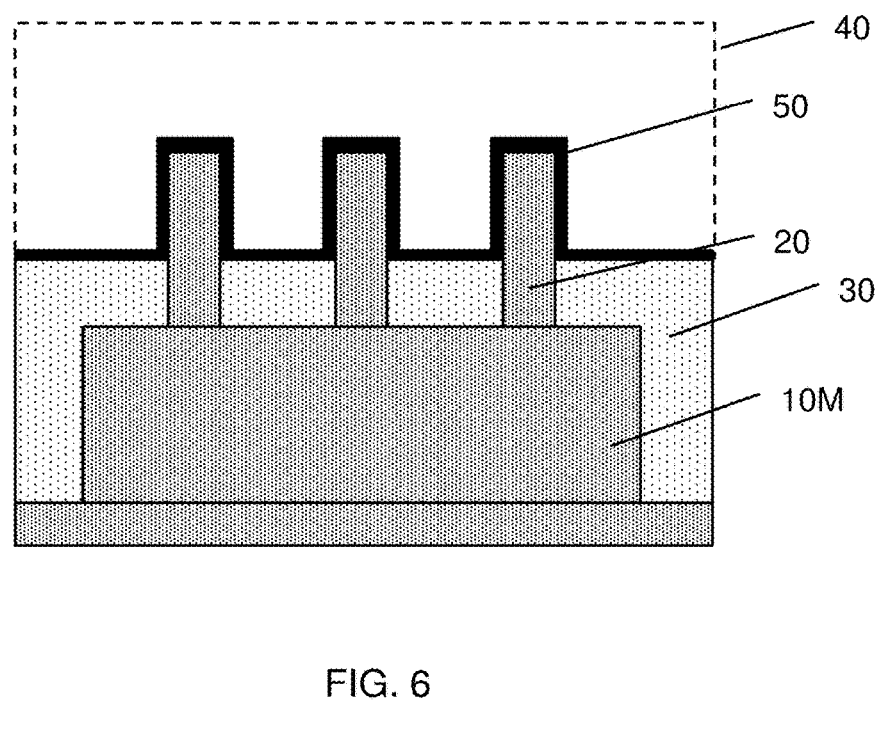
FIG. 6 shows one of various stages for manufacturing a semiconductor FinFET device according to embodiments of the present disclosure.

Then, as shown in FIG. 6, a spacer material layer 50 is formed over the fin structures 20. The spacer material layer 50 is made of dielectric material including silicon nitride based material, such as SiN, SiON, SiOCN or SiOC. In one embodiment, SiN is used as the spacer material layer 50. The spacer material layer 50 is formed by CVD, PVD, ALD, e-beam evaporation, or other suitable process. The thickness of the spacer material layer 50 is in a range from about 30 nm to about 70 nm in some embodiments.

In some embodiments, the spacer material layer 50 and the sidewall spacers 48 for the gate structure are separately formed. In other embodiments, the same blanket layer is used for the spacer material layer 50 and the sidewall spacers 48.

Figure 7A:
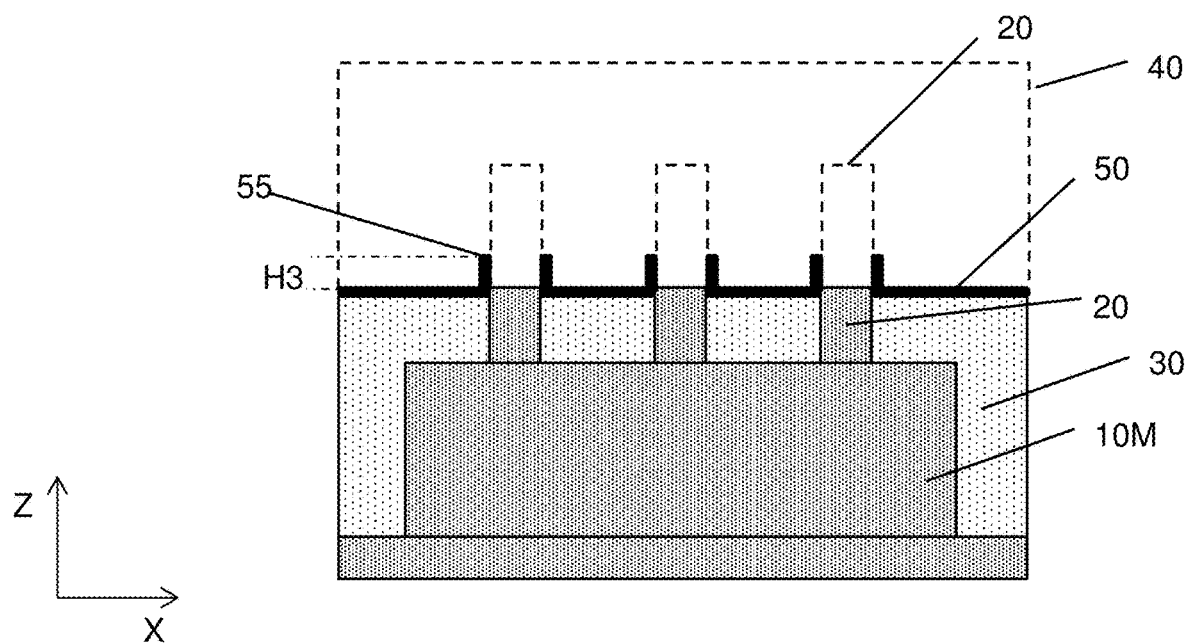
FIGS. 7A, 7B and 7C show one of various stages for manufacturing a semiconductor FinFET device according to embodiments of the present disclosure.

After forming the spacer material layer 50, the upper portion of the fin structures 20 are recessed and a part of the spacer material layer 50 disposed on side surfaces and the top surface of the fin structures protruding from the isolation insulating layer are removed by a dry etching and/or a wet etching operation. The upper portion of the fin structures 20 are recessed (etched) down to the level equal to or below the upper surface of the spacer material layer 50 on the upper surface isolation insulating layer 30, as shown in FIG. 7A. By adjusting etching conditions, for example, an over-etching time, the spacer material layer 50 remains on the upper surface of the isolation insulating layer 30. The thickness of the remaining spacer material layer 50 is in a range from about 2 nm to about 10 nm in some embodiments.

In some embodiments, lower portions of the spacer material layer 50 disposed on sidewall of the fin structures 20 remain without etched away thereby forming fin spacers 55 having a sleeve-like shape, as show in FIG. 7A. The height H3 of the fin spacers 55 is in a range from about 1 nm to about 10 nm in some embodiments, and is in a range from about 5 nm to about 40 nm in some embodiments.

Figure 7B:
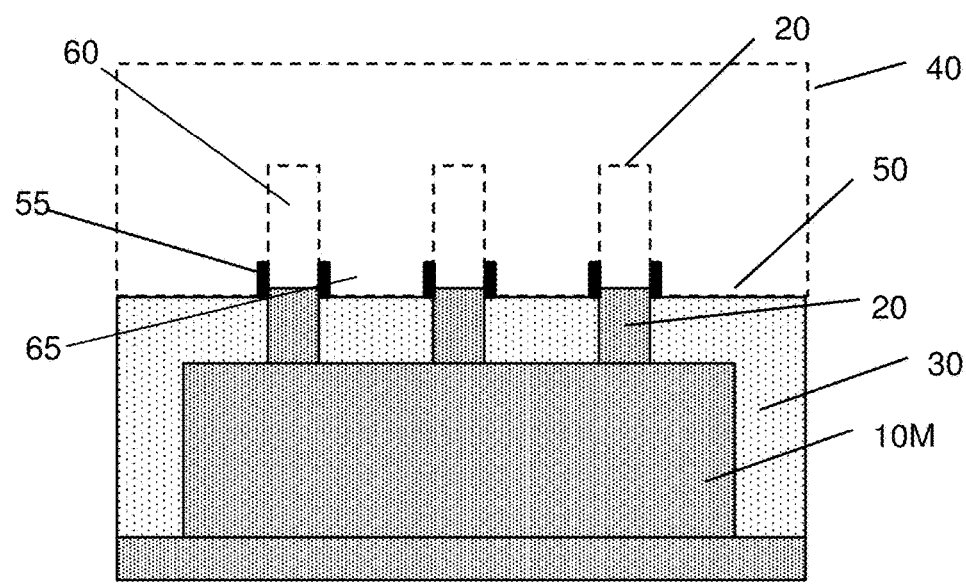
Figure 7C:
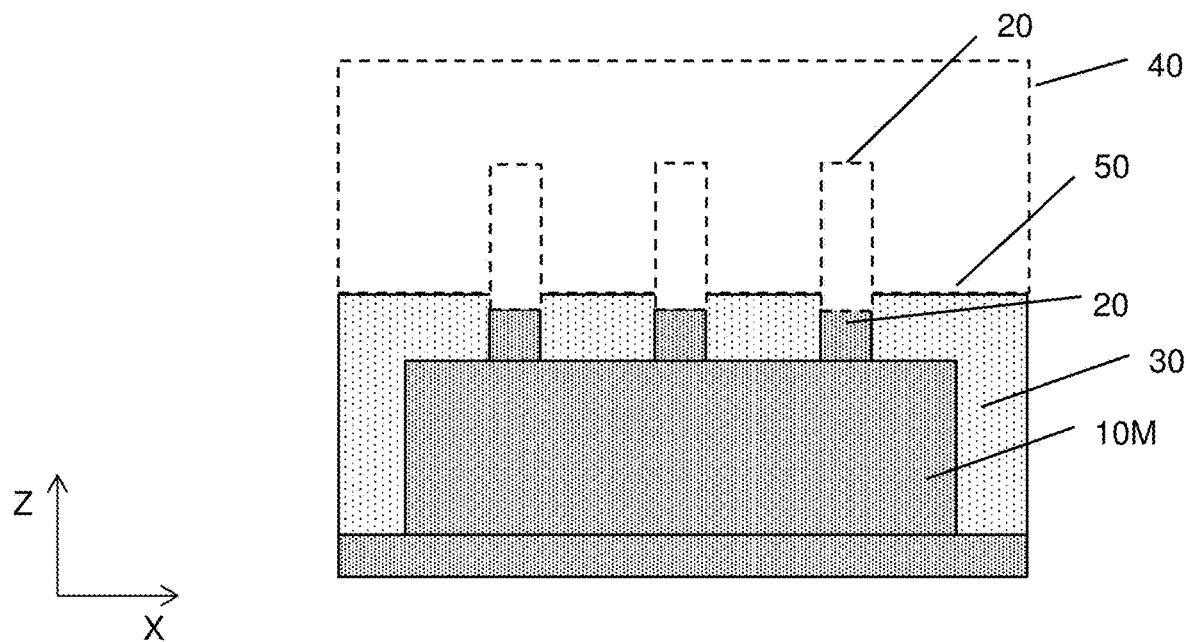

In some embodiments, the spacer material layers 50 disposed over the upper surface of the isolation insulating layer 30 is fully removed, but the fin spacers 55 remain, as shown in FIG. 7B. In other embodiments, the spacer material layer 50 is fully removed, as show in FIG. 7C. In certain embodiments, the spacer material layer 50 remains only on the upper surface of the isolation insulating layer 30 and no sleeve-like portion exists.

In the following embodiments, the subsequent manufacturing operations are performed on the structure shown in FIG. 7A. However, the same or substantially similar operations can be performed on the structures shown in FIGS. 7B and 7C.

Figure 8:
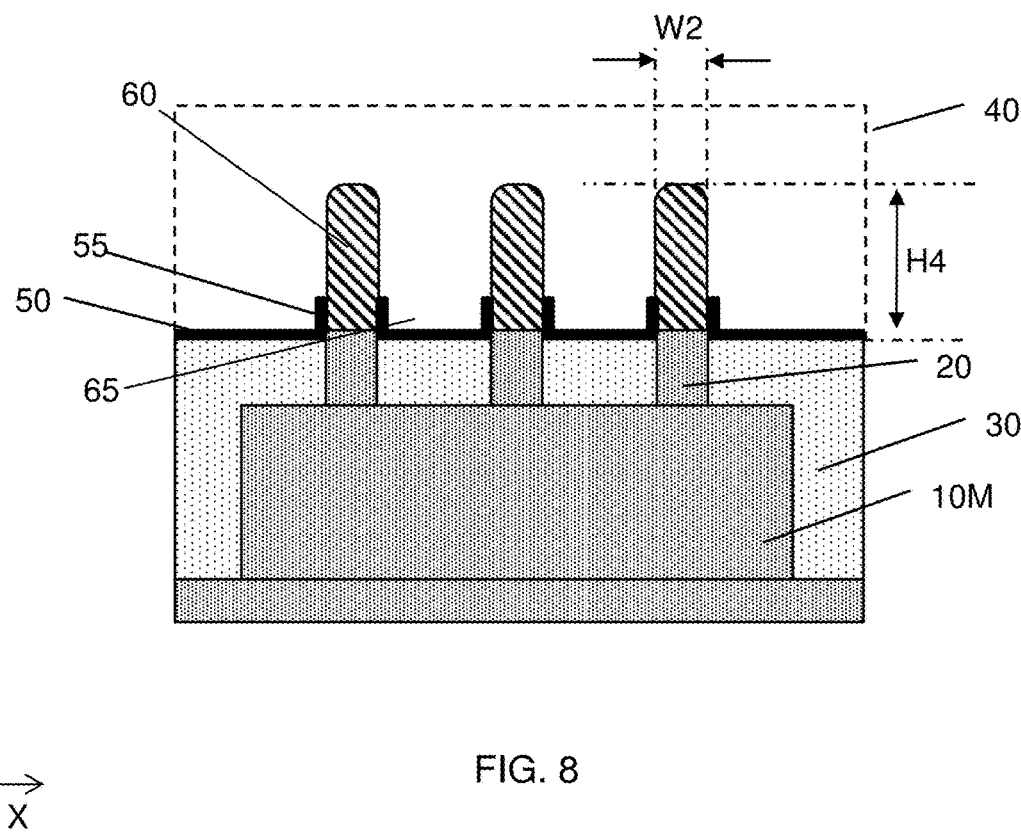
FIG. 8 shows one of various stages for manufacturing a semiconductor FinFET device according to embodiments of the present disclosure.

As shown in FIG. 8, first epitaxial source/drain layers 60 are formed over the recessed fin structures 20, respectively.

The first epitaxial source/drain layers 60 are made of one or more layers of semiconductor material having a different lattice constant than the fin structures 20 (channel regions). When the fin structures are made of Si, the first epitaxial source/drain layers 60 include SiP, SiC or SiCP for an n-channel FinFET and SiGe or Ge for a p-channel FinFET. The first epitaxial source/drain layers 60 are epitaxially formed over the upper portions of the recessed fin structures.

As shown in FIG. 8, the first source/drain epitaxial layers 60 have a bar shape in the cross section along the X direction, and are separated from each other. The aspect ratio H4/W2 of the first source/drain epitaxial layers is in a range from about 2 to about 15 in some embodiments, where H4 is a height of the first source/drain epitaxial layers 60 from the upper surface of the isolation insulating layer 30 and W2 is a largest width of the first epitaxial layer along the X direction.

The bar shaped epitaxial layer 60 can be formed by using a high-temperature deposition technique. The high temperature deposition process can promote the growth of the epicrystallographic facet (100) and possibly impede the growth of the crystallographic facets (110) and (111). The high temperature deposition process can be different for NMOS and PMOS devices. In some embodiments, for NMOS devices, the source/drain epitaxial layer 60 is formed by using a high temperature and pressure deposition process such as a chemical vapor deposition (CVD) process, although other deposition methods can be used in other embodiments. The CVD process can be performed at a high temperature that is within a range of about 650-700° C. and a high pressure that is within a range of about 200-350 Torr. For PMOS devices, the CVD process can be performed at a high temperature that is within a range of about 600-650° C. and a pressure within a range of about 5-50 Torr.

Figure 9:
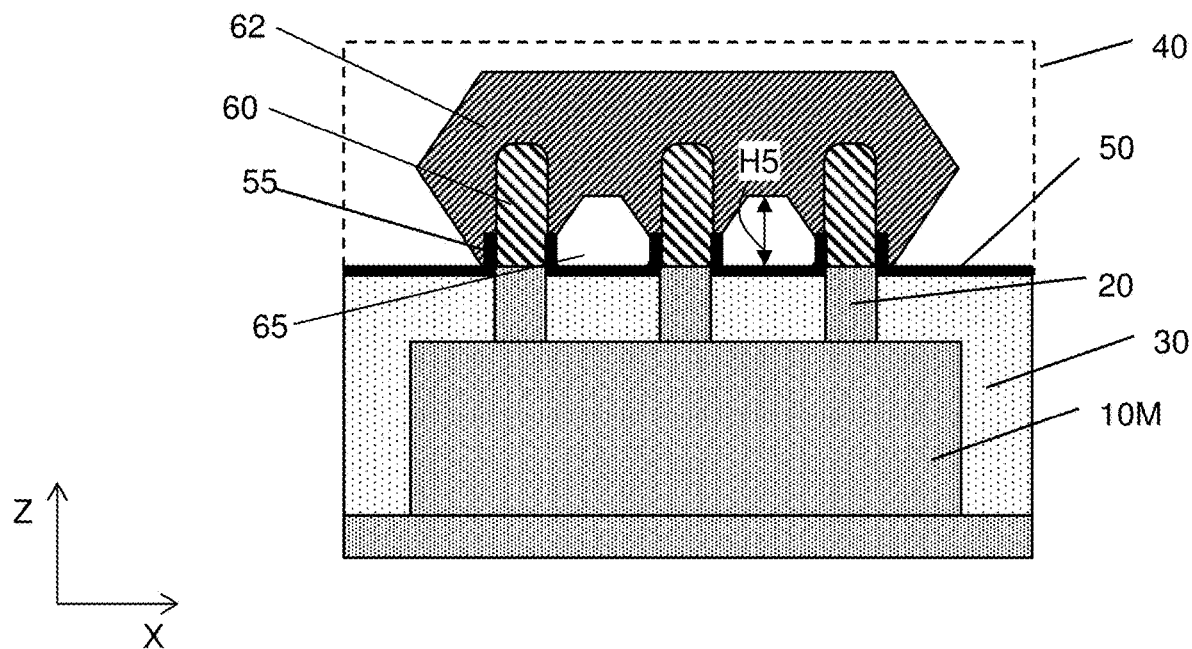
FIG. 9 shows one of various stages for manufacturing a semiconductor FinFET device according to embodiments of the present disclosure.

After the first source/drain epitaxial layers 60 are formed, a second source/drain epitaxial layer 62 is formed over the first source/drain epitaxial layers 60, as shown in FIG. 9. Due to the crystal orientation of the substrate formed into the fin structures 20 and by adjusting epitaxial growth condition, the second epitaxial source/drain layer 62 grows laterally and has a diamond-like shape.

Due to the relatively small space between the fin structures, the adjacent epitaxial source/drain structures formed over each of the first epitaxial layers 60 are merged, thereby forming one second source/drain epitaxial layer. Further, a void or a gap (an air gap) 65 is formed by the second source/drain epitaxial layer 62 and the upper surface of the isolation insulating layer 30, (or and the spacer material layer 50), as shown in FIG. 9.

In particular, due to the spacer material layer 50 on the upper surface of the isolation insulating layer 30, the height H5 of the void 65 is larger than the case where no spacer material layer 50 remains on the upper surface of the isolation insulating layer 30. In some embodiments, the height H5 of the void is in a range from about 5 nm to about 40 nm measured from the upper surface of the spacer material layer 50, and in a range from about 15 nm to about 25 nm in other embodiments. In addition, due to the remaining spacer material layer 50, the isolation insulating layer 30 is protected during the fin etching.

Figure 10:
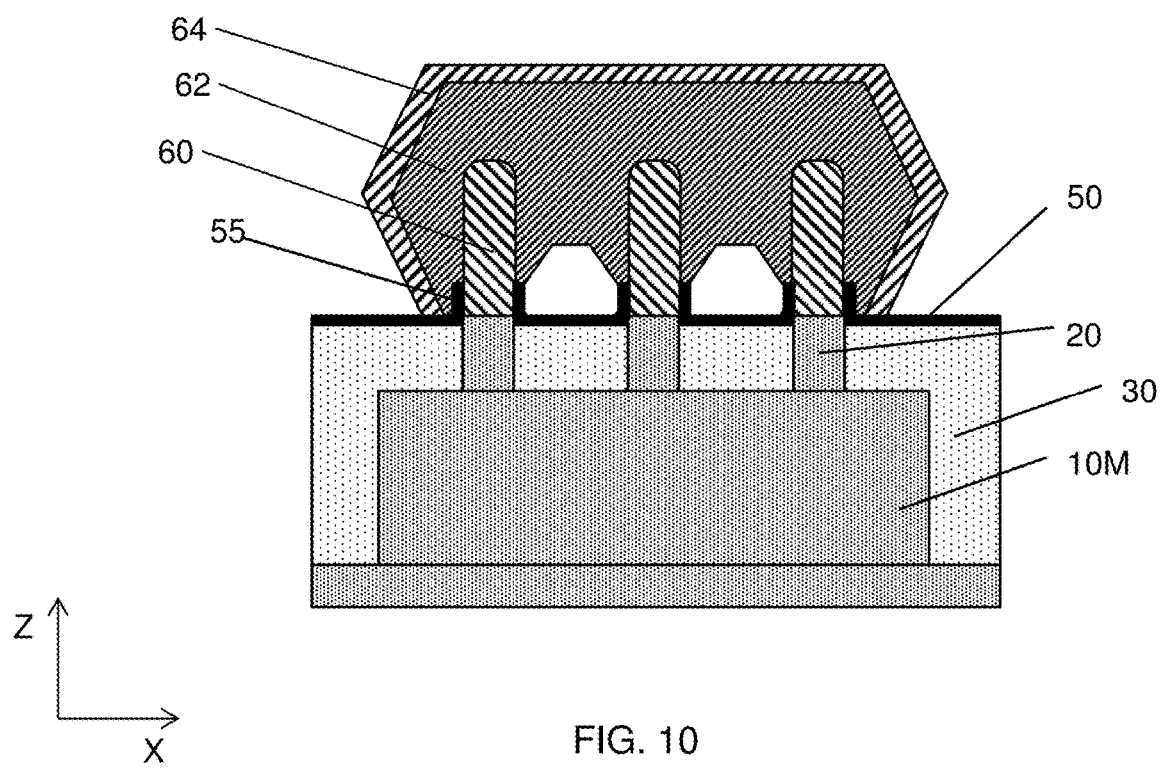
FIG. 10 shows one of various stages for manufacturing a semiconductor FinFET device according to embodiments of the present disclosure.

Further, in some embodiments, a capping layer 64 is formed on the second source/drain epitaxial layer 62, as shown in FIG. 10. In certain embodiments, the capping layer 64 is also a semiconductor epitaxial layer (i.e., a third source/drain epitaxial layer). The thickness of the capping layer is in a range from about 3 nm to about 20 nm in some embodiments.

In some embodiments, the FinFET is a p-type FET. The first source/drain epitaxial layer 60 includes $Si_{1-x}Ge_x$ and the second source/drain epitaxial layer 62 includes $Si_{1-y}Ge_y$, where x<y. In other words, a Ge concentration is smaller in the first source/drain epitaxial layer 60 than in the second source/drain epitaxial layer 62. In certain embodiments, the first source/drain epitaxial layer 60 is made of $Si_{1-x}Ge_x$, where about 0.01<x<about 0.4. In some embodiments, the first source/drain epitaxial layer 60 further includes at least one of B and Ga in an amount of about $5.0×10^{19}$ atoms/cm$^3$ to about $1.0×10^{21}$ atoms/cm$^3$.

In certain embodiments, the second source/drain epitaxial layer 62 includes $Si_{1-y}Ge_y$, where about 0.2<y<about 0.8. In some embodiments, the second source/drain epitaxial layer 62 further includes at last one of B and Ga in an amount of about $1.0×10^{20}$ atoms/cm$^3$ to about $3.0×10^{21}$ atoms/cm$^3$. The amount of B and/or Ga in the first source/drain epitaxial layer 60 is smaller than the amount of B and/or Ga in the second source/drain epitaxial layer 62.

In certain embodiments, the capping layer 64 is an epitaxial layer made of $Si_{1-z}Ge_z$, where 0≤z<about 0.4, where z<y. In other words, a Ge concentration is smaller in the capping layer 64 than in the second source/drain epitaxial layer 62. In some embodiments, the capping layer 64 further includes at least one of B and Ga in an amount of about $5.0×10^{19}$ atoms/cm$^3$ to about $1.0×10^{21}$ atoms/cm$^3$.

In some embodiments, the FinFET is an n-type FET. In certain embodiments, the first source/drain epitaxial layer 60 comprises $Si_{1-x}C_x$ and the second epitaxial layer comprises $Si_{1-y}C_y$, where 0<x<y<about 0.5. In some embodiments, the first source/drain epitaxial layer 60 and the second source/drain epitaxial layer 62 further include at least one of P and As. An amount of P and/or As in the first source/drain epitaxial layer 60 is smaller than an amount of P and/or As in the second source/drain epitaxial layer 62.

In certain embodiments, the first source/drain epitaxial layer 60 includes P and/or As in an amount of about $5.0×10^{19}$ atoms/cm$^3$ to about $2.0×10^{21}$ atoms/cm$^3$, and the second source/drain epitaxial layer 62 includes P and/or As in an amount of about $1.0×10^{20}$ atoms/cm$^3$ to about $8.0×10^{21}$ atoms/cm$^3$.

In certain embodiments, the capping layer 64 is an epitaxial layer including $Si_{1-z}C_z$, where 0≤z<about 0.5. In some embodiments, the capping layer 64 further includes P and/or As in an amount of about 0 to about $1.0×10^{21}$ atoms/cm$^3$.

The first to third source/drain epitaxial layers may be grown at a temperature of about 300 to 900° C. under a pressure of about 1 mTorr to 760 Torr or about $1×10^{-7}$ Torr to about $1×10^{-11}$ Torr by using a Si containing gas, such as $SiH_4$, $Si_2H_6$, $Si_3H_8$ or $SiCl_2H_2$; a Ge containing gas, such as $GeH_4$, $Ge_2H_6$ or $GeCl_2H_2$; a C containing gas, such as $CH_4$ or $C_2H_6$; a dopant gas, such as $B_2H_6$, $PH_3$ or $AsH_3$; or an organic metal material, such as trimethylgallium. The source/drain structure for an n-channel FET and the source/drain structure for a p-channel FET may be formed by separate epitaxial processes.

For the first source/drain epitaxial layer 60, the epitaxial deposition is performed by enhancing a vertical deposition. In some embodiments, the epitaxial deposition of the first source/drain epitaxial layer 60 is performed using a high temperature and pressure deposition process. The epitaxial process is performed at a high temperature that is within a range of about 500-800° C. and a high pressure that is within a range of about 1 mTorr to about 350 Torr in some embodiments.

In other embodiments, the first source/drain epitaxial layer 60 can be formed by the combination of epitaxial growth and etching. In this operation, a base epitaxial layer is first formed over the recessed fin structures. The base epitaxial layer grows vertically and laterally, forming a diamond or hexagonal shape, and the side portions are removed, thereby forming a bar shape.

In some embodiments, the formation process includes an epi-and-etch operation. The epi-and-etch process can be performed the epitaxial deposition at nominal conditions (e.g., to form source/drain epitaxial layer with laterally extended portions) followed by etch operations. After the epitaxial process, lateral portions are removed, thereby forming a bar shape having a top portion with flat side surfaces. In some embodiments, for NMOS device formation, the etch process can be an anisotropic etch operation performed using a mixture of germanium tetrahydride ($GeH_4$) and hydrochloric acid (HCl) with a $GeH_4$ to HCl mixture ratio within a range of about 0.5-1.2. The etch operation can be performed at a high temperature within a range of about 650-750° C. and a pressure within a range of about 5-100 Torr. In other embodiments, other etch processes using different process conditions can be used.

In other embodiments, for PMOS device formation, the etch process can be an etch operation using HCl at a flow rate within a range of about 50-120 sccm. The etch process can be performed at a temperature within a range of about 600-650° C. and a pressure within a range of about 5-50 Torr. In other embodiments, other etch processes using different process conditions can be used.

Figure 11:
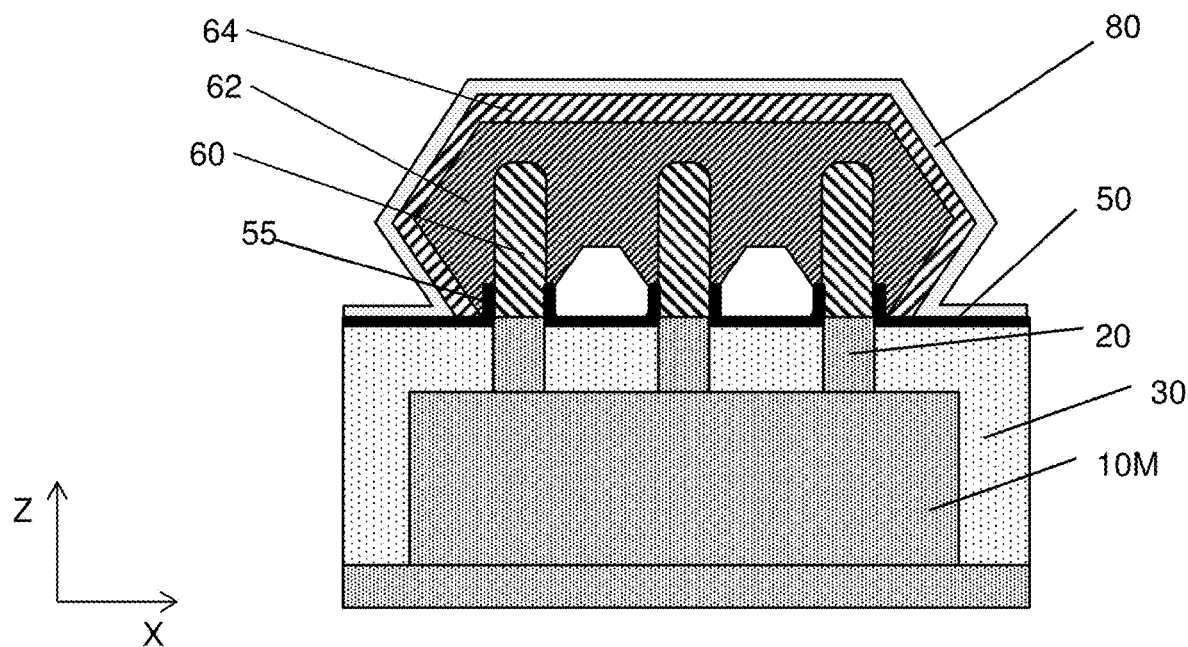
FIG. 11 shows one of various stages for manufacturing a semiconductor FinFET device according to embodiments of the present disclosure.

After the capping layer 64 is formed, an insulating layer 80, functioning as a contact etch stop layer (CESL), is formed over the source/drain epitaxial layers, as shown in FIG. 11. In some embodiments, the CESL 80 is made of, for example, SiN, SiON, SiOCN or SiCN.

Figure 12:
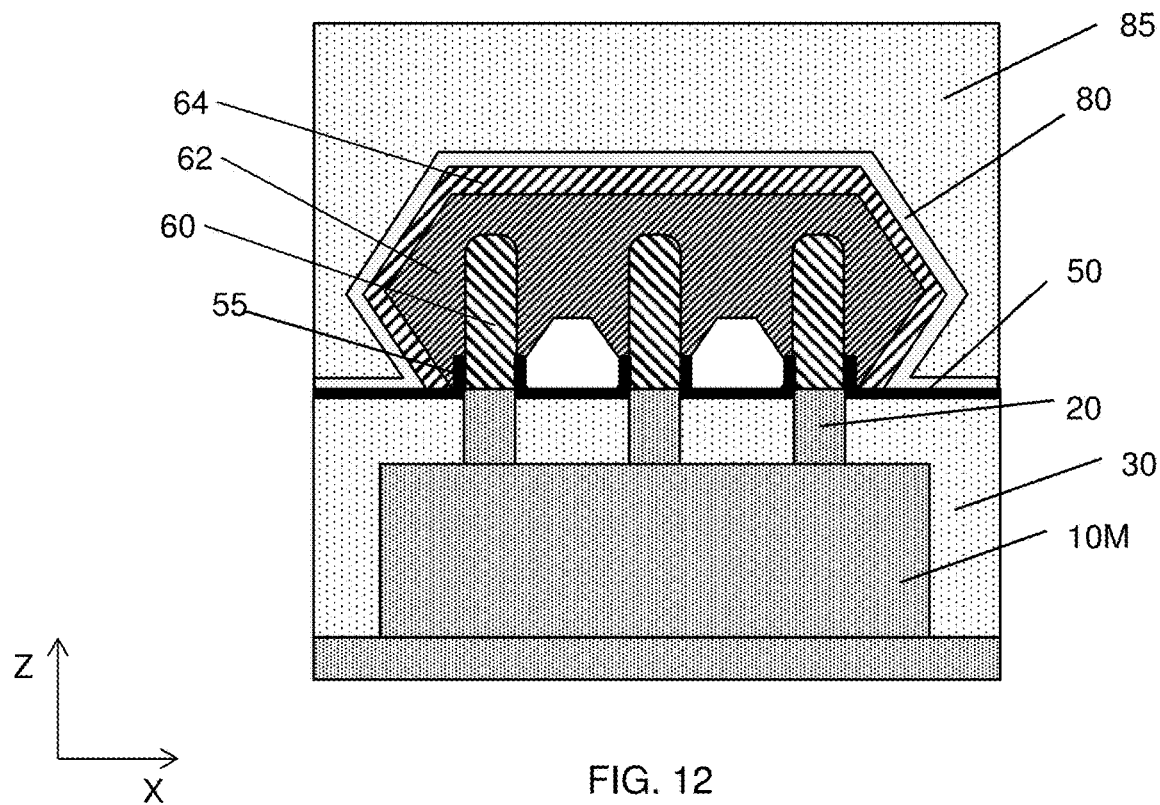
FIG. 12 shows one of various stages for manufacturing a semiconductor FinFET device according to embodiments of the present disclosure.

Further, as shown in FIG. 12, an interlayer dielectric layer 85 is formed over the underlying structure. The ILD layer 85 includes one or more layers of silicon oxide, SiOC, SiOCN or SiCN or other low-k materials, or porous materials, or any other suitable dielectric material.

Figure 13:
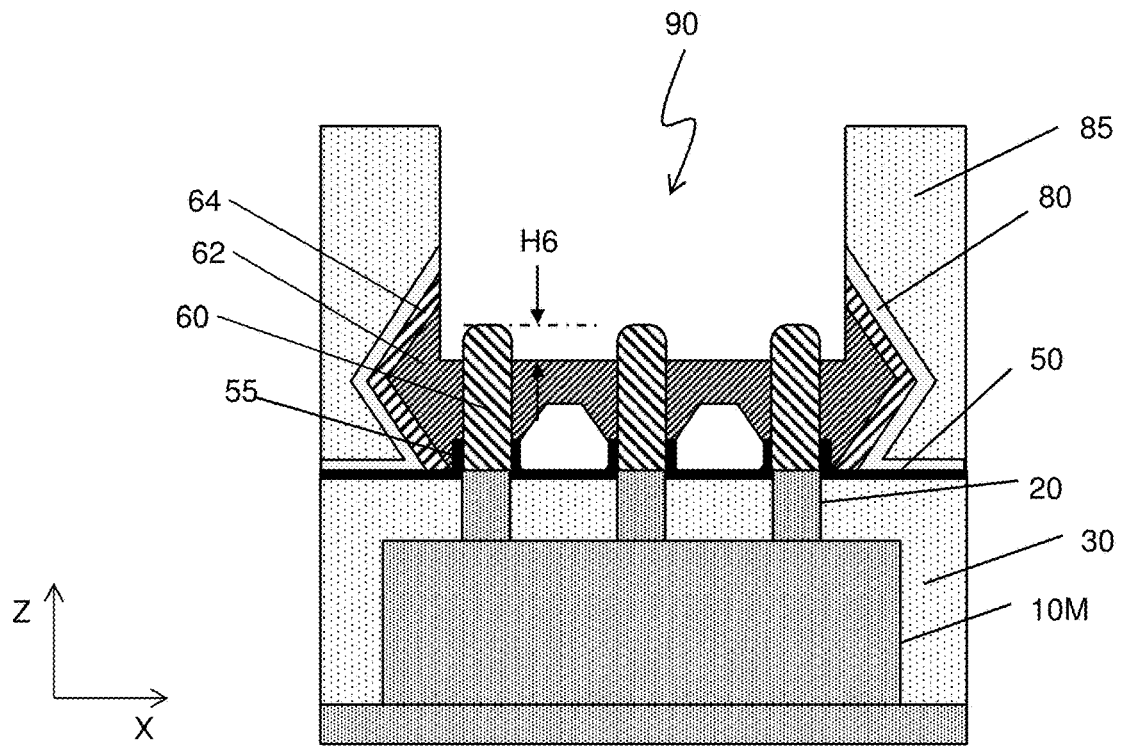
FIG. 13 shows one of various stages for manufacturing a semiconductor FinFET device according to embodiments of the present disclosure.

Then, by using a patterning operation including lithography and etching, a source/drain contact opening 90 is formed in the interlayer dielectric layer 85, as shown in FIG. 13. The etching operations of the ILD layer and the source/drain epitaxial layers are performed by using one or more source gases including HCl, HBr, $CF_4$, $CH_3F$, $CHF_3$, $CH_4$, $SO_2$, $O_2$, He, $NF_3$ and $Cl_2$.

In this patterning operation, the ILD layer 85, the CESL 80, the capping layer 64 and the first and second source/drain epitaxial layers 60 and 62 are partially etched. However, since the first source/drain epitaxial layer 60 has a lower Ge (or P or C) concentration, the etching rate of the first source/drain epitaxial layer 60 is smaller than that of the second source/drain epitaxial layer 62. Accordingly, the first source/drain epitaxial layers 60 protrude from the bottom of the source/drain contact opening 90, as shown in FIG. 13. In some embodiments, the protruding amount H6 of the first source/drain epitaxial layers 60 is in a range from about 2 nm to about 20 nm, and is in a range from about 5 nm to about 10 nm in other embodiments.

Figure 14:
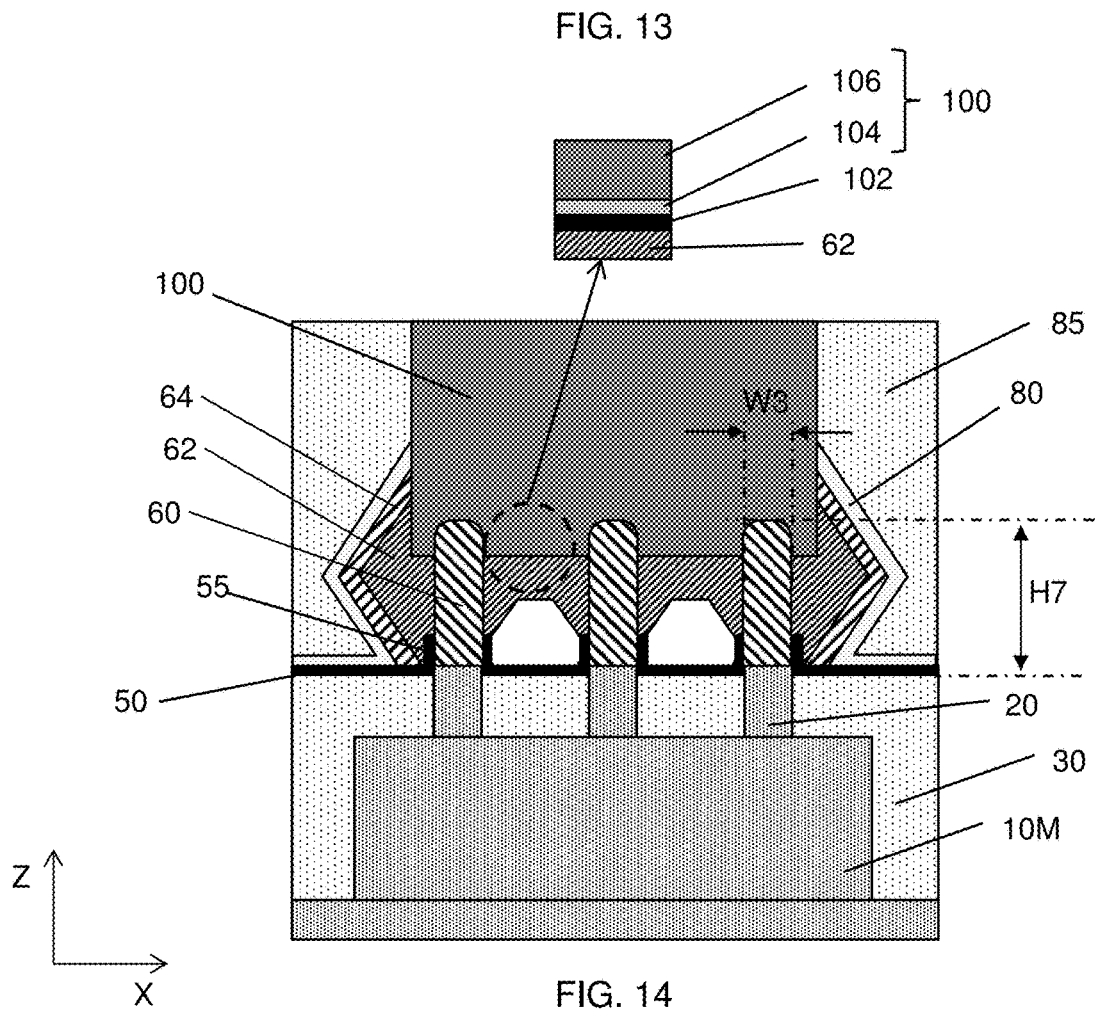
FIG. 14 shows one of various stages for manufacturing a semiconductor FinFET device according to embodiments of the present disclosure.

Subsequently, a source/drain contact layer 100 made of an electrically conductive material is formed in the source/drain contact opening 90 as shown in FIG. 14. FIG. 14 also shows an enlarged view of the circled portion. The source/drain contact layer 100 includes a single layer or multiple layers of any suitable metal such as Co, W, Ti, Ta, Cu, Al and/or Ni and/or nitride thereof.

In some embodiments, a silicide layer 102 is formed over the epitaxial source/drain layers before the contact layer 100 is formed. A metal material, such as Ni, Ti, Ta and/or W, is formed over the source/drain epitaxial layers 60 and 62, and an annealing operation is performed to form a silicide layer 102. In other embodiments, a silicide material, such as NiSi, TiSi, TaSi and/or WSi, is formed over the epitaxial source/drain layers, and an annealing operation may be performed. The annealing operation is performed at a temperature of about 250° C. to about 850° C. The metal material or the silicide material is formed by CVD or ALD. The thickness of the silicide layer 102 is in a range from about 4 nm to about 10 nm in some embodiments. In other embodiments, when the contact layer 100 including Ni, Ti, Ta and/or W is formed on the source/drain layers, a silicide layer 102 is simultaneously formed.

In some embodiments, the conductive source/drain contact layer 100 includes a blanket layer of an adhesive (glue) layer 104 and a body metal layer 106. The adhesive layer 104 includes one or more layers of conductive materials. In some embodiments, the adhesive layer 104 includes a TiN layer formed on a Ti layer. Any other suitable conductive material can be used. The thickness of each of the TiN layer and the Ti layer is in a range from about 1 nm to about 5 nm in some embodiments. The adhesive layer 104 can be formed by CVD, PVD, ALD, electro-plating, a combination thereof, or other suitable film forming methods. The adhesive layer 104 is used to prevent the body metal layer 106 from peeling off. In some embodiments, no adhesive layer is used and the body metal layer is directly formed in the contact openings. In some embodiments, the Ti layer of the adhesive layer can be used as the metal layer for forming a silicide layer 102.

The body metal layer 106 is one of Co, W, Mo and Cu, or any other suitable conductive material in some embodiments. In one embodiment, Co is used as the body metal layer. The body metal layer can be formed by CVD, PVD, ALD, electro-plating, a combination thereof or other suitable film forming methods. After the conductive material layer(s) is formed, a planarization operation, such as chemical mechanical polishing (CMP) or etch-back operations, is performed to remove the excess materials, thereby forming a source/drain contact layer 100, as shown in FIG. 14.

The aspect ratio H7/W3 of the first source/drain epitaxial layers is in a range from about 4 to about 15 in some embodiments, where H7 is a height of the first source/drain epitaxial layers 60 from the upper surface of the isolation insulating layer 30 and W3 is a largest width of the first epitaxial layer along the X direction.

As shown in FIG. 14, the first source/drain epitaxial layers 60 protrude from the bottom of the contact opening 90 and penetrate into the contact layer 100, and the electrically conductive contact layer 100 is in contact with upper surfaces and side surfaces of the upper portions (protruding portions) of the first source/drain epitaxial layers 60. Further, a bottom of the electrically conductive contact layer 100 is located closer to the substrate than an uppermost portion of the first source/drain epitaxial layers 60. With these structures, the interfacial area between the contact layer 100 and the source/drain epitaxial layers (or silicide layer) increases, thereby decreasing the contact resistance between the contact layer 100 and the source/drain epitaxial layers (or silicide layer).

In some embodiments, before the contact opening 90 is formed, a metal gate structure (not shown) is formed. After forming the ILD layer 85, the dummy gate structure (dummy gate electrode 44 and dummy gate dielectric layer 42) are removed and replaced with a metal gate structure (metal gate electrode and gate dielectric layer). In certain embodiments, after the ILD layer 85 is formed, the dummy gate electrode 44 and the dummy gate dielectric layer 42 are removed, by appropriate etching processes, respectively, to form a gate opening. Metal gate structures including a gate dielectric layer and metal gate electrode are formed in the gate openings. The gate dielectric layer may be formed over an interface layer (not shown) disposed over the channel layer of the fin structures 20. The interface layer may include silicon oxide or germanium oxide with a thickness of 0.2 nm to 1.5 nm in some embodiments. In other embodiments, the thickness of the interface layer is in a range about 0.5 nm to about 1.0 nm. The gate dielectric layer includes one or more layers of dielectric materials, such as silicon oxide, silicon nitride, or high-k dielectric material, other suitable dielectric material, and/or combinations thereof. Examples of high-k dielectric material include $HfO_2$, HfSiO, HfSiON, HfTaO, HfSiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The gate dielectric layer is formed by, for example, chemical vapor deposition (CVD), physical vapor deposition (PVD), atomic layer deposition (ALD), high density plasma CVD (HDPCVD), or other suitable methods, and/or combinations thereof. The thickness of the gate dielectric layer is in a range from about 1 nm to about 10 nm in some embodiments, and may be in a range from about 2 nm to about 7 nm in other embodiments. The metal gate electrode is formed over the gate dielectric layer. The metal gate electrode includes one or more layers of any suitable metal material, such as aluminum, copper, titanium, tantalum, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. In certain embodiments of the present disclosure, one or more work function adjustment layers (not shown) may be interposed between the gate dielectric layer and the metal gate electrode. The work function adjustment layer is made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FinFET, one or more of TaN, TaAlC, TiN, TiC, Co, TiAl, TiSi and TaSi is used as the work function adjustment layer, and for the p-channel FinFET, one or more of TiAlC, Al, TiAl, TaN, TaAlC, TiN, TiC and Co is used as the work function adjustment layer. After depositing appropriate materials for the metal gate structures, planarization operations, such as CMP, are performed.

After forming the contact layer 100, further CMOS processes are performed to form various features such as additional interlayer dielectric layers, contacts/vias, interconnect metal layers, and passivation layers, etc.

In an alternative embodiment, the silicide layer is formed before the contact opening 90 is formed. In such a case, after forming the silicide layer, the ILD layer 85 is formed.

Figure 15A:
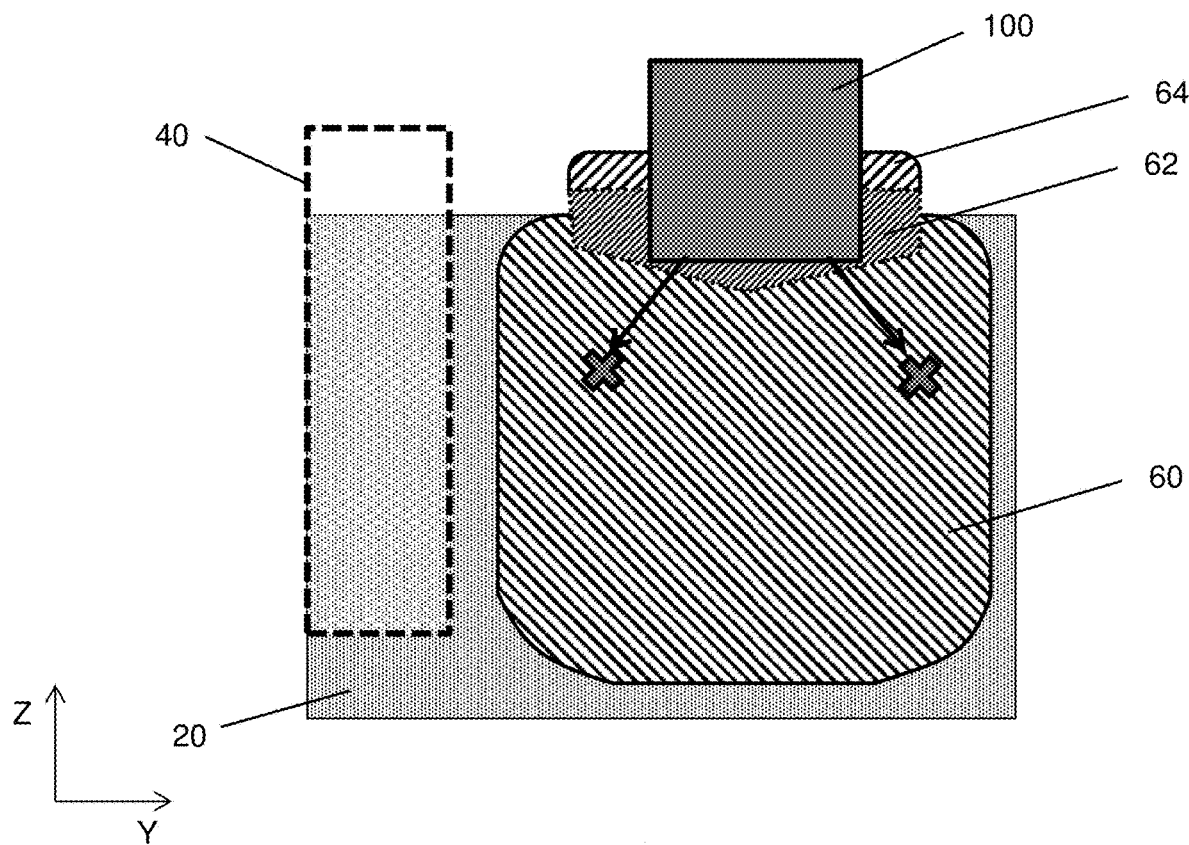
FIGS. 15A and 15B show cross sectional views showing source/drain structures.
Figure 15B:
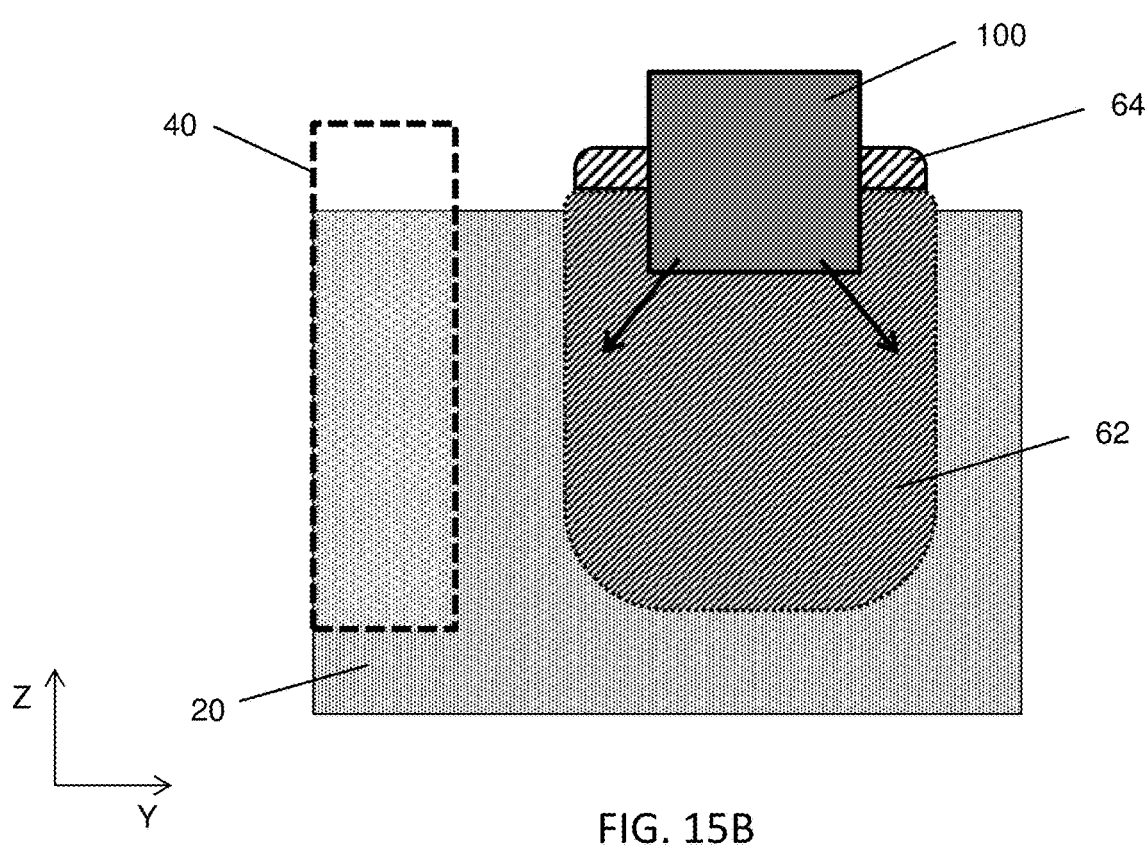

FIGS. 15A and 15B show cross sectional views along the Y direction of the source/drain regions. FIG. 15A corresponds to the structure of FIG. 14 and FIG. 15B corresponds to the structure formed without forming the first source/drain epitaxial layer 60.

In the structure of FIG. 15B, since the epitaxial layer 62 contains a relatively higher amount of Ge, metal element(s) of the contact layer 100 may diffuse into the epitaxial layer 62, causing higher contact resistance. In contrast, in the structure of FIG. 15A, since the epitaxial layer 60 contains a relatively lower amount of Ge, the metal element(s) of the contact layer 100 can be blocked from diffusing into the source/drain epitaxial layers, thereby reducing contact resistance.

Figure 16:
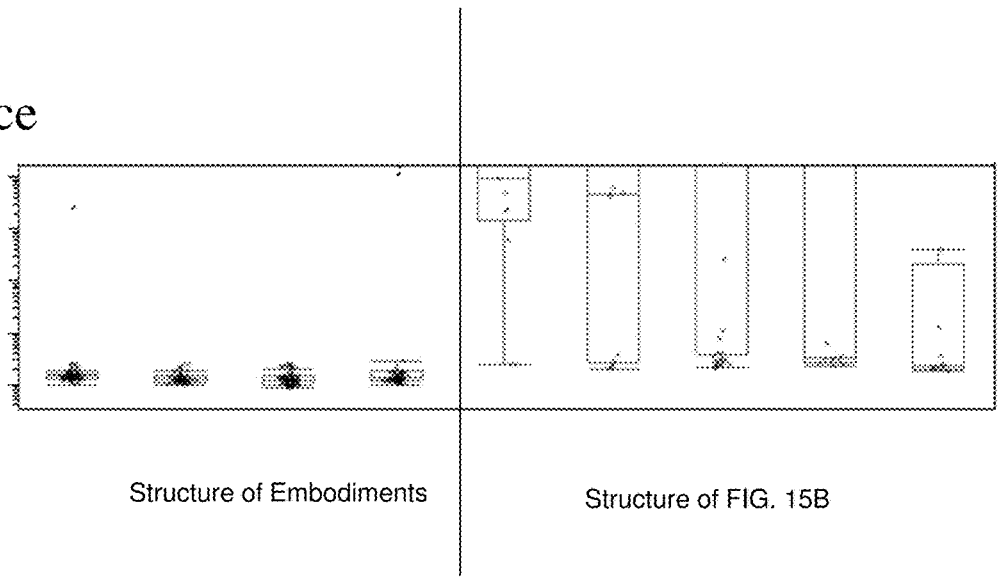
FIG. 16 shows experimental results of source/drain contact resistance.

FIG. 16 shows experimental results of source/drain contact resistance between the structures of FIGS. 15A and 15B. As shown in FIG. 16, the contact resistance values of the structure of FIG. 15A is lower and have smaller variations than the structure of FIG. 15B.

In the foregoing embodiments, the number of fin structures (the number of the first epitaxial layers 60) per contact layer 100 is three. However, the number of fins per contact layer 100 can be one, two, four, five or more. In multiple fin structures, the second source/drain epitaxial layer 62 is a merged structure with or without a void(s).

In the present disclosure, since first bar-shaped source/drain epitaxial layers having a lower Ge concentration are formed, it is possible to increase the interfacial area between the source/drain contact and the source/drain epitaxial layer (or silicide layer), thereby decreasing the contact resistance.

It will be understood that not all advantages have been necessarily discussed herein, no particular advantage is required for all embodiments or examples, and other embodiments or examples may offer different advantages.

In accordance with one aspect of the present disclosure, in a method of manufacturing a semiconductor device including a FinFET, a first epitaxial layer is formed at a source/drain region of a fin structure for the FinFET. A second epitaxial layer is formed over the first epitaxial layer. The second epitaxial layer has a material composition different from the first epitaxial layer. An interlayer dielectric (ILD) layer is formed over the first and second epitaxial layers. A contact opening is formed by etching a part of the ILD layer and a part of the second epitaxial layer. The first epitaxial layer protrudes from a bottom of the contact opening. In one or more of the foregoing or following embodiments, an electrically conductive contact layer is further in contact with the first and second epitaxial layers in the contact opening. A bottom of the electrically conductive contact layer is located below an uppermost portion of the first epitaxial layer. In one or more of the foregoing or following embodiments, the FinFET is a p-type, and the first epitaxial layer includes $Si_{1-x}Ge_x$ and the second epitaxial layer includes $Si_{1-y}Ge_y$, where x<y. In one or more of the foregoing or following embodiments, the first epitaxial layer includes $Si_{1-x}Ge_x$, where 0.01<x<0.4. In one or more of the foregoing or following embodiments, the first epitaxial layer further includes at least one of B and Ga in an amount of $5.0 \times 10^{19}$ atoms/cm³ to $1.0 \times 10^{21}$ atoms/cm³. In one or more of the foregoing or following embodiments, the second epitaxial layer includes $Si_{1-y}Ge_y$, where 0.2<y<0.8. In one or more of the foregoing or following embodiments, the second epitaxial layer further includes at last one of B and Ga in an amount of $1.0 \times 10^{20}$ atoms/cm³ to $3.0 \times 10^{21}$ atoms/cm³. In one or more of the foregoing or following embodiments, the first epitaxial layer and the second epitaxial layer further include at least one of B and Ga, and an amount of at least one of B and Ga in the first epitaxial layer is smaller than an amount of at least one of B and Ga in the second epitaxial layer. In one or more of the foregoing or following embodiments, a capping layer made of a semiconductor material is further formed on the second epitaxial layer. In one or more of the foregoing or following embodiments, the capping layer is an epitaxial layer comprising $Si_{1-z}Ge_z$, where 0≤z<0.4, where z<y. In one or more of the foregoing or following embodiments, the capping layer further includes at least one of B and Ga in an amount of $5.0 \times 10^{19}$ atoms/cm³ to $1.0 \times 10^{21}$ atoms/cm³.

In accordance with another aspect of the present disclosure, in a method of manufacturing a semiconductor device including a FinFET, a first fin structure and a second fin structure are formed over a substrate such that upper portions of the first and second fin structures protrude from an isolation insulating layer. A gate structure is formed over parts of the first and second fin structures. A spacer material layer is formed on sidewalls of the first and second fin structures protruding from the isolation insulating layer and not covered by the gate structure, and on an upper surface of the isolation insulating layer. Upper portions of the first and second fin structures are recessed, thereby forming a recessed first fin structure and a recessed second fin structure. First epitaxial layers are formed over the recessed first and second fin structures, respectively, the first epitaxial layers being separated from each other. A second epitaxial layer is formed over the first epitaxial layers. The second epitaxial layer has a material composition different from the first epitaxial layer. An interlayer dielectric (ILD) layer is formed over the first and second epitaxial layers. A contact opening is formed by etching a part of the ILD layer and a part of the second epitaxial layer. The first epitaxial layers protrude from a bottom of the contact opening. In one or more of the foregoing or following embodiments, a void is formed between the second epitaxial layer and the upper surface of the isolation insulating layer. In one or more of the foregoing or following embodiments, in the recessing upper portions of the first and second fin structures, lower portions of the spacer material layer disposed on the sidewalls of the first and second fin structures and the spacer material layer disposed on the upper surface of the isolation insulating layer remain. A void is formed between the second epitaxial layer and the remaining spacer material layer on the upper surface of the isolation insulating layer. In one or more of the foregoing or following embodiments, an electrically conductive contact layer is further formed in contact with the first and second epitaxial layers in the contact opening. A bottom of the electrically conductive contact layer is located below an uppermost portion of the first epitaxial layers. In one or more of the foregoing or following embodiments, the FinFET is a p-type, and the first epitaxial layer includes $Si_{1-x}Ge_x$ and the second epitaxial layer includes $Si_{1-y}Ge_y$, where x<y. In one or more of the foregoing or following embodiments, the first epitaxial layers include $Si_{1-x}Ge_x$, where 0.01<x<0.4, and the second epitaxial layer includes $Si_{1-y}Ge_y$, where 0.2<y<0.8. In one or more of the foregoing or following embodiments, the first epitaxial layers further include at least one of B and Ga in an amount of $5.0 \times 10^{19}$ atoms/cm$^3$ to $1.0 \times 10^{21}$ atoms/cm$^3$. In one or more of the foregoing or following embodiments, the second epitaxial layer further includes at last one of B and Ga in an amount of $1.0 \times 10^{20}$ atoms/cm$^3$ to $3.0 \times 10^{21}$ atoms/cm$^3$. In one or more of the foregoing or following embodiments, an amount of at least one of B and Ga in the first epitaxial layers is smaller than an amount of at least one of B and Ga in the second epitaxial layer. In one or more of the foregoing or following embodiments, an aspect ratio H/W of the first epitaxial layers is in a range from 4 to 20, where H is a height of the first epitaxial layers from the upper surface of the isolation insulating layer and W is a largest width of the first epitaxial layers along a direction in which the gate structure extends.

In accordance with another aspect of the present disclosure, in a method of manufacturing a semiconductor device including a FinFET, three or more fin structures are formed over a substrate such that upper portions of the fin structures protrude from an isolation insulating layer. A gate structure is formed over parts of the fin structures. Upper portions of the fin structures are recessed, thereby forming recessed fin structures. First epitaxial layers are formed over the recessed fin structures, respectively. The first epitaxial layers are separated from each other. A second epitaxial layer is formed over the first epitaxial layers. The second epitaxial layer has a material composition different from the first epitaxial layer. A third epitaxial layer is formed over the second epitaxial layer. The third epitaxial layer has a material composition different from the second epitaxial layer. An interlayer dielectric (ILD) layer over the first, second and third epitaxial layers. A contact opening is formed by etching a part of the ILD layer and a part of the third and second epitaxial layers. An aspect ratio H/W of the first epitaxial layers is in a range from 4 to 20, where H is a height of the first epitaxial layers from the upper surface of the isolation insulating layer and W is a largest width of the first epitaxial layers along a direction in which the gate structure extends.

In accordance with one aspect of the present disclosure, a semiconductor device includes a gate structure formed over a channel region of the semiconductor device, a source/drain region adjacent the channel region, and an electrically conductive contact layer over the source/drain region. The source/drain region includes a first epitaxial layer having a first material composition, and a second epitaxial layer formed over the first epitaxial layer, the second epitaxial layer having a second material composition different from the first composition. The electrically conductive contact layer is in contact with the first and second epitaxial layers, and a bottom of the electrically conductive contact layer is located below an uppermost portion of the first epitaxial layer. In one or more of the foregoing or following embodiments, the semiconductor device is a p-type field effect transistor (FET), and the first epitaxial layer includes $Si_{1-x}Ge_x$ and the second epitaxial layer includes $Si_{1-y}Ge_y$, where x<y. In one or more of the foregoing or following embodiments, the first epitaxial layer includes $Si_{1-x}Ge_x$, where 0.01<x<0.4. In one or more of the foregoing or following embodiments, the first epitaxial layer further includes at least one of B and Ga in an amount of $5.0 \times 10^{19}$ atoms/cm$^3$ to $1.0 \times 10^{21}$ atoms/cm$^3$. In one or more of the foregoing or following embodiments, the second epitaxial layer includes $Si_{1-y}Ge_y$, where 0.2<y<0.8. In one or more of the foregoing or following embodiments, the second epitaxial layer further includes at last one of B and Ga in an amount of $1.0 \times 10^{20}$ atoms/cm$^3$ to $3.0 \times 10^{21}$ atoms/cm$^3$. In one or more of the foregoing or following embodiments, the first epitaxial layer and the second epitaxial layer further include at least one of B and Ga, and an amount of at least one of B and Ga in the first epitaxial layer is smaller than an amount of at least one of B and Ga in the second epitaxial layer. In one or more of the foregoing or following embodiments, a capping layer made of a semiconductor material is further disposed on the second epitaxial layer. In one or more of the foregoing or following embodiments, the capping layer is an epitaxial layer comprising $Si_{1-z}Ge_z$, where 0≤z<0.4, where z<y. In one or more of the foregoing or following embodiments, the capping layer further includes at least one of B and Ga in an amount of $5.0 \times 10^{19}$ atoms/cm$^3$ to $1.0 \times 10^{21}$ atoms/cm$^3$. In one or more of the foregoing or following embodiments, the semiconductor device is an n-type field effect transistor (FET), and the first epitaxial layer includes $Si_{1-x}C_x$ and the second epitaxial layer includes $Si_{1-y}C_y$. In one or more of the foregoing or following embodiments, the first epitaxial layer and the second epitaxial layer further include at least one of P and As, and an amount of at least one of P and As in the first epitaxial layer is smaller than an amount of at least one of P and As in the second epitaxial layer. In one or more of the foregoing or following embodiments, the first epitaxial layer includes at least one of P and As in an amount of $5.0 \times 10^{19}$ atoms/cm$^3$ to $2.0 \times 10^{21}$ atoms/cm$^3$. In one or more of the foregoing or following embodiments, the second epitaxial layer includes at least one of P and As in an amount of $1.0 \times 10^{20}$ atoms/cm$^3$ to $8.0 \times 10^{21}$ atoms/cm$^3$. In one or more of the foregoing or following embodiments, a capping layer made of a semiconductor material is further disposed on the second epitaxial layer. In one or more of the foregoing or following embodiments, the capping layer is an epitaxial layer comprising $Si_{1-z}C_z$. In one or more of the foregoing or following embodiments, the capping layer further includes at least one of P and As in an amount of $1.0 \times 10^{20}$ atoms/cm$^3$ to $8.0 \times 10^{21}$ atoms/cm$^3$. In one or more of the foregoing or following embodiments, an aspect ratio H/W of the first epitaxial layer is in a range from 4 to 20, where H is a height of the first epitaxial layers from the upper surface of the isolation insulating layer and W is a largest width of the first epitaxial layer along a direction in which the gate structure extends.

In accordance with another aspect of the present disclosure, a semiconductor device including a FinFET is provided. The FinFET includes: first fin structure and a second fin structure disposed over a substrate, upper portions of the first and second fin structures protruding from an isolation insulating layer; a gate structure over parts of the first and second fin structures; first epitaxial layers disposed over source/drain regions of the first and second fin structures, respectively, the first epitaxial layers being separated from each other; a second epitaxial layer disposed over the first epitaxial layers, the second epitaxial layer having a material composition different from the first epitaxial layer; an interlayer dielectric (ILD) layer disposed over the first and second epitaxial layers; and an electrically conductive contact layer in contact with the first and second epitaxial layers. A bottom of the electrically conductive contact layer is located closer to the substrate than an uppermost portion of the first epitaxial layer. In one or more of the foregoing or following embodiments, a void is formed between the second epitaxial layer and the upper surface of the isolation insulating layer. In one or more of the foregoing or following embodiments, the first epitaxial layers include $Si_{1-x}Ge_x$, where $0.01<x<0.4$, and the second epitaxial layer includes $Si_{1-y}Ge_y$, where $0.2<y<0.8$.

In accordance with another aspect of the present disclosure, a semiconductor device including a FinFET is provided. The FinFET includes: three or more fin structures disposed over a substrate such that upper portions of the fin structures protruding from an isolation insulating layer; a gate structure disposed over parts of the fin structures; first epitaxial layers disposed over source/drain regions of the fin structure, respectively, the first epitaxial layers being separated from each other; a second epitaxial layer disposed over the first epitaxial layers, the second epitaxial layer having a material composition different from the first epitaxial layer; a third epitaxial layer disposed over the second epitaxial layer, the third epitaxial layer having a material composition different from the second epitaxial layer; and a contact opening disposed in contact with the first, second and third epitaxial layers. The electrically conductive contact layer is in contact with upper surfaces and side surfaces of upper portions of the first epitaxial layers.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   an isolation insulating layer disposed over a substrate;
   a gate structure formed over a channel region of the semiconductor device, the gate structure including a gate electrode and gate sidewall spacers;
   a first epitaxial layer having a first material composition;
   a second epitaxial layer formed over the first epitaxial layer, the second epitaxial layer having a second material composition different from the first composition;
   a fin spacer layer disposed at a bottom of the first epitaxial layer; and
   an electrically conductive contact layer over the first and second epitaxial layers,
   wherein a top of the fin spacer layer is located below a top of the first epitaxial layer, and
   wherein the first epitaxial layer comprises a first portion and a second portion that is separated from the first portion and each of the first portion and the second portion is embedded into the electrically conductive contact layer.

2. The semiconductor device of claim 1, wherein the fin spacer layer is made of silicon nitride.

3. The semiconductor device of claim 1, wherein each of the first portion and the second portion of the first epitaxial layer penetrates the electrically conductive contact layer by an amount of 5 nm or more.

4. The semiconductor device of claim 1, wherein an aspect ratio H/W of each of the first portion and the second portion of the first epitaxial layer is in a range from 4 to 15, where H is a height of the first portion and the second portion of the first epitaxial layer from an upper surface of an isolation insulating layer and W is a largest width of the first portion and the second portion of the first epitaxial layer along a direction in which the gate structure extends.

5. The semiconductor device of claim 1, further comprising a third epitaxial layer made of a third material composition different from the second material composition and disposed on the second epitaxial layer.

6. The semiconductor device of claim 5, wherein the first epitaxial layer comprises $Si_{1-x}Ge_x$, the second epitaxial layer comprises $Si_{1-y}Ge_y$, and the third epitaxial layer comprises $Si_{1-z}Ge_z$, where $x<y$ and $z<y$.

7. The semiconductor device of claim 6, wherein the third epitaxial layer further comprises B in an amount of $5.0 \times 10^{19}$ atoms/cm$^3$ to $1.0 \times 10^{21}$ atoms/cm$^3$.

8. The semiconductor device of claim 6, wherein the third epitaxial layer further comprises Ga in an amount of $5.0 \times 10^{19}$ atoms/cm$^3$ to $1.0 \times 10^{21}$ atoms/cm$^3$.

9. A semiconductor device comprising:
   an isolation insulating layer disposed over a substrate;
   a first fin structure and a second fin structure disposed over a substrate, wherein the first and second fin structures protrude from a mesa structure disposed over the substrate;
   a gate structure over parts of the first and second fin structures, the gate structure including a gate electrode and gate sidewall spacers;

a first epitaxial layer disposed over a source/drain region of each of the first and second fin structures, wherein the first epitaxial layer over the first fin structure is separated from the first epitaxial layer over the second fin structure;
a second epitaxial layer disposed over the first epitaxial layer, the second epitaxial layer having a material composition different from the first epitaxial layer;
an electrically conductive contact layer over the first and second epitaxial layers; and
a third epitaxial layer comprising $Si_{1-z}Ge_z$, where x<y and z<y,
wherein:
the first epitaxial layer comprises $Si_{1-x}Ge_x$, where 0.01<x<0.4;
the second epitaxial layer comprises $Si_{1-y}Ge_y$, where 0.2<y<0.8;
the second epitaxial layer connects the first epitaxial layer over the first fin structure and the first epitaxial layer over the second fin structure; and
the first epitaxial layer penetrates the electrically conductive contact layer.

10. The semiconductor device of claim 9, further comprising a fin spacer layer disposed at and in contact with a bottom of the first epitaxial layer,
wherein a top of the fin spacer layer is located below a top of the first epitaxial layer.

11. The semiconductor device of claim 10, further comprising a void between the first epitaxial layer over the first fin structure and the first epitaxial layer over the second fin structure,
wherein the second epitaxial layer, a part of the fin spacer layer disposed at the bottom of the first epitaxial layer over the first fin structure and a part of the fin spacer layer disposed at the bottom of the first epitaxial layer over the second fin structure are exposed to the void.

12. The semiconductor device of claim 11, wherein the isolation insulating layer is exposed to the void.

13. The semiconductor device of claim 11, wherein the fin spacer layer is in contact with the second epitaxial layer.

14. The semiconductor device of claim 11, wherein the fin spacer layer is in contact with the isolation insulating layer.

15. The semiconductor device of claim 9, wherein the third epitaxial layer is disposed on the second epitaxial layer.

16. The semiconductor device of claim 9, wherein the third epitaxial layer further comprises at least one of Ga or B in an amount of $5.0 \times 10^{19}$ atoms/cm$^3$ to $1.0 \times 10^{21}$ atoms/cm$^3$.

17. A semiconductor device comprising:
three or more fin structures disposed over a substrate;
a gate structure disposed over parts of the three or more fin structures;
a first epitaxial layer disposed over a source/drain region of each of the three or more fin structures, wherein the first epitaxial layer over one of the three or more fin structures is separated from the first epitaxial layer over adjacent ones of the three or more fin structures;
a second epitaxial layer disposed over the first epitaxial layer, the second epitaxial layer having a material composition different from the first epitaxial layer and fully separating the first epitaxial layer over one of the three or more fin structures from the first epitaxial layer over adjacent ones of the three or more fin structures;
a third epitaxial layer disposed over the second epitaxial layer, the third epitaxial layer having a material composition different from the second epitaxial layer; and
an electrically conductive contact layer over the first, second and third epitaxial layers,
wherein the electrically conductive contact layer covers an upper surface and side surfaces of an upper portion of the first epitaxial layer of each of the three or more fin structures.

18. The semiconductor device of claim 17, wherein:
the first epitaxial layer comprises $Si_{1-x}Ge_x$, the second epitaxial layer comprises $Si_{1-y}Ge_y$,
and the third epitaxial layer comprises $Si_{1-z}Ge_z$, where x<y and z<y, and the third epitaxial layer further comprises at least one of B and Ga in an amount of $5.0 \times 10^{19}$ atoms/cm$^3$ to $1.0 \times 10^{21}$ atoms/cm$^3$.

19. The semiconductor device of claim 17, wherein the first epitaxial layer comprises a first bar-shaped portion formed over a first fin structure that is separated from a second bar-shaped portion of the first epitaxial layer formed over a second fin structure.

20. The semiconductor device of claim 19, wherein an aspect ratio H/W of each of the first bar-shaped portion and the second bar-shaped portion of the first epitaxial layer is in a range from 4 to 15, where H is a height of the first bar-shaped portion and the second bar-shaped portion from an upper surface of an isolation insulating layer and W is a largest width of the first bar-shaped portion and the second bar-shaped portion along a direction in which the gate structure extends.

* * * * *